US010501848B2

(12) United States Patent
Spath et al.

(10) Patent No.: US 10,501,848 B2
(45) Date of Patent: Dec. 10, 2019

(54) DEPOSITION SYSTEM WITH MODULAR DEPOSITION HEADS

(71) Applicant: Eastman Kodak Company, Rochester, NY (US)

(72) Inventors: Todd Mathew Spath, Hilton, NY (US); Lee William Tutt, Webster, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 315 days.

(21) Appl. No.: 15/458,297

(22) Filed: Mar. 14, 2017

(65) Prior Publication Data

US 2018/0265979 A1    Sep. 20, 2018

(51) Int. Cl.
| | | |
|---|---|---|
| C23C 16/40 | (2006.01) | |
| C23C 16/455 | (2006.01) | |
| C23C 16/44 | (2006.01) | |
| C23C 16/54 | (2006.01) | |

(52) U.S. Cl.
CPC .... C23C 16/45544 (2013.01); C23C 16/4412 (2013.01); C23C 16/45527 (2013.01); C23C 16/45551 (2013.01); C23C 16/45574 (2013.01); C23C 16/545 (2013.01)

(58) Field of Classification Search
CPC ............ C23C 16/45544; C23C 16/545; C23C 16/45574; C23C 16/45551; C23C 16/4412; C23C 16/45527
USPC ....... 118/715, 729, 719; 156/345.33, 345.34, 156/345.31
See application file for complete search history.

(56) References Cited

U.S. PATENT DOCUMENTS

| | | | |
|---|---|---|---|
| 5,136,975 A | | 8/1992 | Bartholomew et al. |
| 5,380,396 A | * | 1/1995 | Shikida ................. F04B 43/043 118/728 |
| 6,955,725 B2 | * | 10/2005 | Dando ................ C23C 16/4409 118/715 |

(Continued)

FOREIGN PATENT DOCUMENTS

| | | |
|---|---|---|
| EP | 1 283 279 | 2/2003 |
| JP | 2005-179705 | 7/2005 |

OTHER PUBLICATIONS

E. Granneman, "Conduction Heating in RTP Fast, and Pattern-independent," Materials Science Forum, vols. 573-574, pp. 375-386.

(Continued)

*Primary Examiner* — Rudy Zervigon
(74) *Attorney, Agent, or Firm* — Kevin E. Spaulding

(57) ABSTRACT

A deposition unit for a thin film deposition system includes one or more of deposition heads and a gas manifold. Each deposition head includes an output face having a plurality of gas openings, a mounting face including a plurality of deposition head gas ports, and connecting gas passages. The gas manifold includes an attachment face having one or more interface regions, each interface region including a plurality of manifold gas ports in positions corresponding to the deposition head gas ports. Each deposition head is fastened to the gas manifold in an interface region with sealing elements positioned between the manifold gas ports and the deposition head gas ports. The mounting face of each deposition head and the attachment face of the gas manifold include alignment features for aligning each deposition head with the interface region of the gas manifold.

25 Claims, 32 Drawing Sheets

(56) References Cited

U.S. PATENT DOCUMENTS

| | | |
|---|---|---|
| 7,413,982 B2 | 8/2008 | Levy |
| 7,456,429 B2 | 11/2008 | Levy |
| 7,572,686 B2 | 8/2009 | Levy et al. |
| 7,789,961 B2 | 9/2010 | Nelson et al. |
| 7,850,780 B2 | 12/2010 | Levy et al. |
| 8,182,608 B2 | 5/2012 | Kerr et al. |
| 8,211,231 B2 | 7/2012 | Kerr et al. |
| 8,361,544 B2 | 1/2013 | Fedorovskaya et al. |
| 8,398,770 B2 | 3/2013 | Levy et al. |
| 8,420,168 B2 | 4/2013 | Kerr et al. |
| 8,529,990 B2 | 9/2013 | Fedorovskaya et al. |
| 2009/0130858 A1 | 5/2009 | Levy et al. |
| 2009/0304924 A1 | 12/2009 | Gadgil |
| 2011/0097487 A1 | 4/2011 | Kerr et al. |
| 2011/0097488 A1 | 4/2011 | Kerr et al. |
| 2011/0097489 A1 | 4/2011 | Kerr et al. |
| 2011/0097490 A1 | 4/2011 | Kerr et al. |
| 2011/0097491 A1 | 4/2011 | Levy et al. |
| 2011/0097492 A1 | 4/2011 | Kerr et al. |
| 2011/0097493 A1 | 4/2011 | Kerr et al. |
| 2011/0097494 A1* | 4/2011 | Kerr ................ C23C 16/45551 427/255.5 |
| 2014/0377963 A1 | 12/2014 | Ellinger et al. |
| 2016/0245434 A1 | 8/2016 | Seeley |

OTHER PUBLICATIONS

D. Levy et al., "Oxide Electronics by Spatial Atomic Layer Deposition," J. Display Technology, vol. 5, pp. 484-494 (2009).

P. Poodt et al., "Spatial atomic layer deposition: A route towards further industrialization of atomic layer deposition," J. Vac. Sci. Technol. A, vol. 30, pp. 010802-1-010802-11 (2012).

* cited by examiner

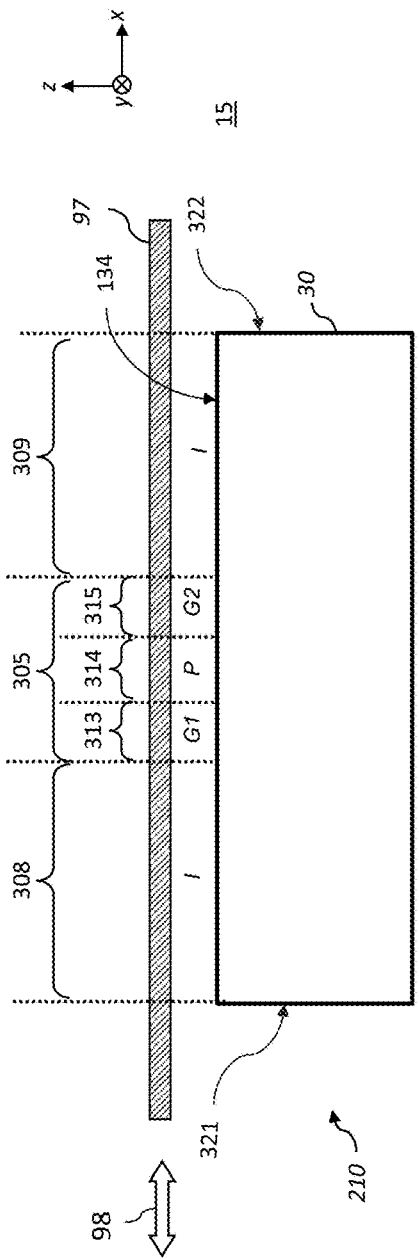
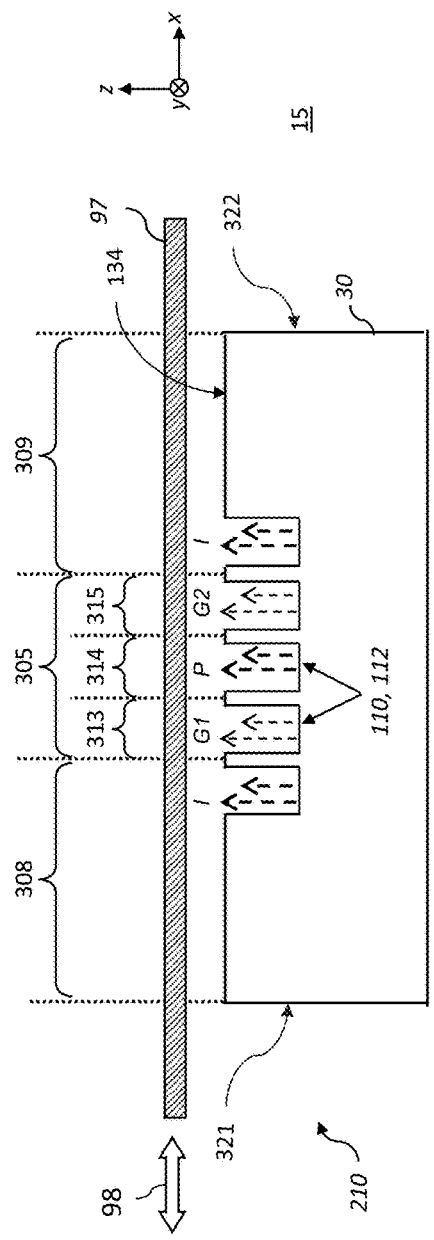
FIG. 2A
FIG. 2B

DEPOSITION SYSTEM WITH MODULAR DEPOSITION HEADS

CROSS-REFERENCE TO RELATED APPLICATIONS

Reference is made to commonly assigned, U.S. patent application Ser. No. 15/458,235, entitled "Modular thin film deposition system," by Spath et al.; to commonly assigned, co-pending U.S. patent application Ser. No. 15/458,250, entitled "Deposition system with vacuum pre-loaded deposition head," by Spath et al.; to commonly assigned, co-pending U.S. patent application Ser. No. 15/458,262, entitled "Dual gas bearing substrate positioning system," by Spath; to commonly assigned, co-pending U.S. patent application Ser. No. 15/458,270, entitled "Deposition system with moveable-position web guides," by Spath et al.; to commonly assigned, co-pending U.S. patent application Ser. No. 15/458,287, entitled "Deposition system with repeating motion profile," by Spath et al.; to commonly assigned, co-pending U.S. patent application Ser. No. 15/458,307, entitled "Porous gas-bearing backer," by Spath; to commonly assigned, co-pending U.S. patent application Ser. No. 15/458,322, entitled "Deposition system with interlocking deposition heads," by Tutt et al.; to commonly assigned, co-pending U.S. patent application Ser. No. 15/458,335, entitled "Vertical system with vacuum pre-loaded deposition head," by Spath et al.; and to commonly assigned, co-pending U.S. patent application Ser. No. 15/458,345, entitled "Heated gas-bearing backer," by Spath, each of which is incorporated herein by reference.

FIELD OF THE INVENTION

This invention generally relates to the deposition of thin-film materials, and more particularly to a deposition system including modular gas delivery heads.

BACKGROUND OF THE INVENTION

There is a growing interest in depositing thin-film materials from gaseous precursors on a wide range of substrates for a wide variety of applications. Substrates of interest include both rigid substrates, such as flat-panel glass, and flexible substrates, such as plastic webs or metal foils. Flexible supports are of particular interest since they can be more mechanically robust, lighter weight, and allow for more economic manufacturing (e.g., by enabling roll-to-roll processing) than rigid substrates. Thin-film deposition systems, similar to their liquid coating counterparts, are advantaged if the deposition head, or gas delivery device, is smaller in area than the area of the substrate to be coated. For substrates that are continuous, such as webs and foils, the use of a deposition head that is smaller than the area of the substrate is a requirement not just an advantage.

Among the techniques widely used for thin-film deposition is chemical vapor deposition (CVD), which uses chemically reactive molecules that react to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition (ALD) is a thin-film deposition technology that provides excellent thickness control of conformal thin-films. The ALD process segments the thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In temporal vacuum ALD, thin-film growth is accomplished by alternating the delivery of two or more reactive materials, or precursors, into a vacuum chamber in time. Sequentially, a first precursor is applied to react with the substrate, the excess of the first precursor is removed, and a second precursor is then applied to react with the substrate surface. The excess of the second precursor is then removed and the process is repeated. In all ALD processes, the substrate is exposed sequentially to a series of reactants that react with the substrate and are kept isolated from each other to avoid CVD or gas phase reactions. An ALD cycle is defined by the steps required to form a single layer of the overall thin-film material; for a process using two precursors a cycle is defined as the first precursor exposure, a purge step, the second precursor exposure, and a second precursor purge step.

A version of ALD processes known as spatial atomic layer deposition (SALD) employs a continuous (as opposed to pulsed) gaseous material distribution from a deposition head. As distributed from the deposition head, the gaseous precursors are separated in space by the flow of an inert gas, rather than being separated in time. While vacuum chambers can be used with SALD, they are no longer necessary due to the physical separation of the gas flows rather than a temporal separation of the precursors within a single chamber. In SALD systems, the required sequential exposures are accomplished by relative movement between the substrate and the delivery head such that any given point on the substrate sees the necessary sequence of gaseous materials. This relative movement can be accomplished by moving a substrate relative to a fixed delivery head, moving a delivery head with respect to a fixed substrate, or moving both the delivery head and the substrate in order to achieve the desired gas exposure at the substrate. Exemplary SALD processes, are described in commonly-assigned U.S. Pat. Nos. 7,413,982, 7,456,429, 7,789,961, and U.S. Patent Application Publication 2009/0130858, the disclosures of which are incorporated herein by reference. SALD enables operation at atmospheric or near-atmospheric pressures and is capable of operating in an unsealed or open-air environment, making it compatible with web coating.

SALD offers considerable promise as a technique for thin film deposition on a range of substrates. However, in spite of its inherent technical capabilities and advantages, a number of technical hurdles still remain. As in all ALD processes, the thickness of the SALD deposited thin-film is controlled by the number of ALD cycles to which the substrate is exposed, where a cycle is defined by the exposure of the substrate to the minimum required reactant and purge gas flows to form the desired thin-film composition. Due to the process being limited to an atomic layer of growth per cycle, repeated cycles are required to deposit a thin-film having an appreciable thickness. In order to effectively achieve repeated cycles, SALD requires either motion of the substrate past the deposition head or the development of complex equipment such that the delivery head moves with its gas connections, relative to the substrate. Thin-films of appreciable thickness can be accomplished by either 1) using a deposition head containing a sufficient number of gas distribution cycles and moving a substrate (or head) in a unidirectional motion relative to the head (or substrate) or 2) using a head with a limited number of cycles and using relative reciprocating motion. In instances where the substrate or the deposition head are moved by a reciprocating movement, there remains a technical challenge to manage the sequence of gas exposures since the substrate can be exposed to the gases in a different sequence during a forward stroke and a backward stroke. Furthermore, in order to deposit a thin-film over an entire substrate, the substrate or the head may have to travel a long distance in order to expose substrate to the process gases. There remains a need to provide alternative arrangements to both the very large deposition heads and long distance motion profiles such that large substrates may be easily coated.

One alternative to a single large deposition head is to use multiple deposition heads, or modules, within a larger deposition section. Commonly-assigned U.S. Pat. No. 8,182,608 (Kerr et al.), which is incorporated herein by reference, relates to an apparatus for maintaining the alignment or positional relationship between at least two modules in a SALD system. U.S. Pat. No. 8,182,608 describes aligning multiple delivery heads in a 1-D array, addressing the ability to coating longer substrates or provide thicker thin-film coatings. While simplifying the manufacturing of the deposition head, it does not address the challenge of making coatings of different thicknesses using the same tool, or the footprint required for providing a large deposition section in a manufacturing environment. Additionally, there remains a need for a way to arrange modular heads to be able to coat wider substrates without coating defects or non-uniformity. Additionally, there remains a need for a motion profile that enables the use of small deposition heads in order to build up a sufficient layer thickness from a SALD. Furthermore, there remains a need for a substrate handling means for coating on roll-to-roll webs that enables exposure of the substrate to multiple SALD cycles during deposition, while simultaneously moving the substrate smoothly from the feed roll to the take-up roll.

In order function properly, a SALD system must maintain the separation of the reactant gases. Although separated in space and by a purge gas as delivered by the deposition head, the system must be further designed to insure that the gases do not mix in the region between the deposition head and the substrate. Commonly-assigned U.S. Patent Application Publication 2009/0130858 (Levy), relates to a SALD deposition system and method using a delivery head where the distance between the substrate and the deposition head is maintained by gas pressure. In this device, the pressure of flowing reactive and purge gases is used as a means to control the separation between the deposition head and the substrate. Due to the relatively large pressures that can be generated in such a system, gases are forced to travel in well-defined paths and thus eliminate undesired gas intermixing.

The system of U.S. Patent Application Publication 2009/0130858 operates as a gas-bearing SALD system. The gas bearing operation maintains a close proximity of the substrate to the deposition head, and either the substrate or head must be free to move in the direction normal the deposition head. The use of a gas bearing SALD head is advantaged due to the resultant pressure profiles that separate the precursor gasses by the purge gas and prevent undesired gas intermixing. There remains a need for SALD systems that utilize a gas-bearing deposition head to coat large substrates, particularly for depositions systems with small manufacturing footprints. There remains a need to coat long substrates with deposition heads that are considerably smaller than the coating length, both for piece-parts and particularly for roll-to-roll webs; this need further necessitates novel motion control profiles and substrate handling. There remains a further need for roll-to-roll SALD systems that utilize a gas-bearing deposition head having a simple construction, as well as roll-to-roll systems that can manage potential substrate distortions and can isolate the motion needed for deposition from the global motion of the web through the system. Additionally, there remains a need, for a modular system that can accommodate different substrate form factors, including roll-to-roll webs of substrate, and provide a system that is relatively low in cost and easy to use.

SUMMARY OF THE INVENTION

The present invention represents a deposition unit for a thin film deposition system, including:
  a machine base;
  one or more of deposition heads, each deposition head including:
    an output face having a plurality of gas openings;
    a mounting face opposite to and parallel with the output face, the mounting face including a plurality of deposition head gas ports; and
    gas passages connecting each of the gas openings on the output face to one of the deposition head gas ports; and
  a gas manifold rigidly attached to the machine base including:
    an attachment face having one or more interface regions, each interface region being configured to interface with the mounting face of a deposition head and including a plurality of manifold gas ports in positions corresponding to the deposition head gas ports;
    a plurality of gas connections; and
    gas passages connecting each of the manifold gas ports to one of the gas connections;
  wherein each of the deposition heads is rigidly fastened to the gas manifold in an interface region with sealing elements positioned between the manifold gas ports and the deposition head gas ports;
  wherein the mounting face of each deposition head and the attachment face of the gas manifold include alignment features for aligning each deposition head with the interface region of the gas manifold.

It is an advantage of the present invention that SALD deposition heads may be removed and replaced easily. It is an advantage of the present invention that SALD deposition heads can be repeatably positioned with high precision, maintaining the position and planarity of the output face. It is the additional advantage that SALD deposition heads can be arranged in an extensible array to cover wider areas using a plurality of smaller heads.

BRIEF DESCRIPTION OF THE DRAWINGS

FIGS. 2A-2C are cross-sectional side views of SALD deposition heads useful in the present invention having a single ALD cycle;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
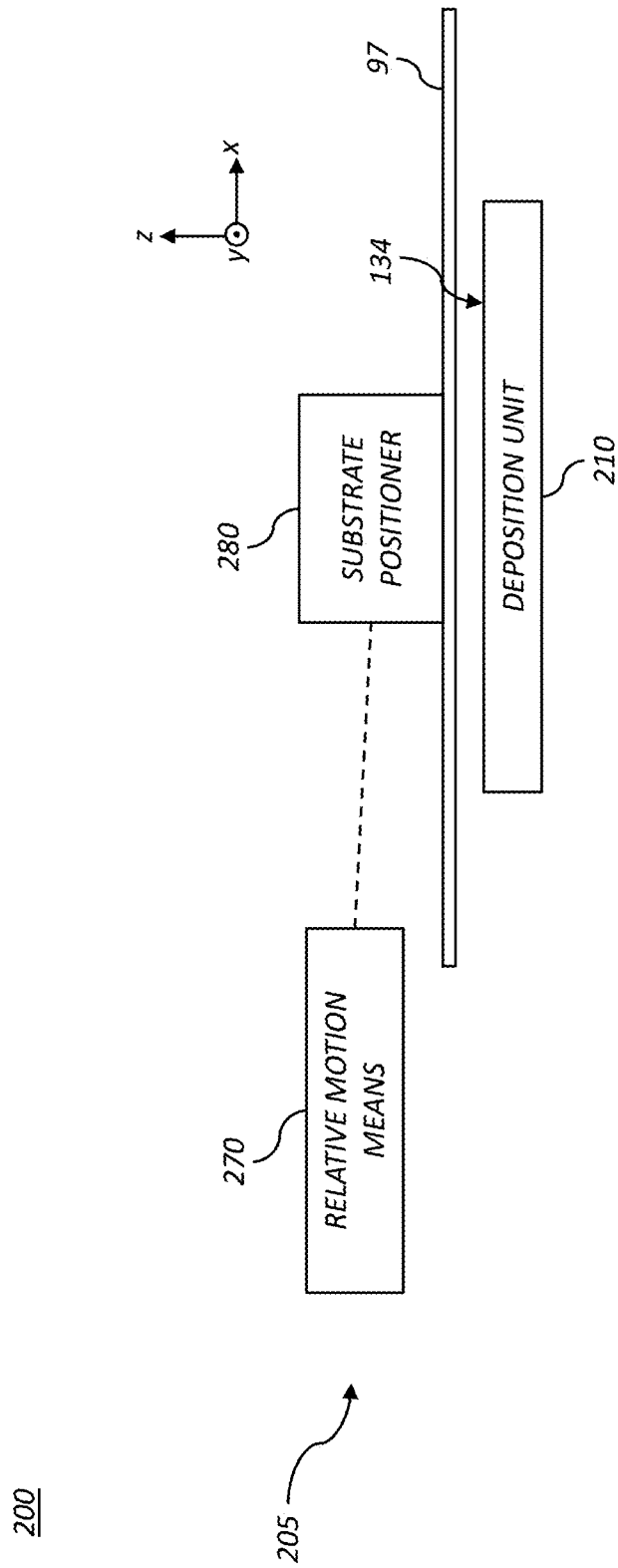
FIG. 1 is schematic block diagram showing the functional elements of an SALD deposition system.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," and "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are generally not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

The embodiments of the present invention relate components for systems useful for thin-film deposition. In preferred embodiments, the thin-film deposition is done using a spatial atomic layer deposition (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. Reactant gas flows can include multiple reactive species together with inert gaseous species. In some embodiments, the reactive gases can include a reactive plasma, such as supplied by a remote plasma source. One type of remote plasma source that can be used includes a surface dielectric barrier discharge source. As such, plasma-enhanced spatial ALD (PE-SALD) arrangements are considered to be useful in some embodiments. While the exemplary embodiments are described in the context of SALD systems, those skilled in the art will recognize that aspects of the present invention can also be used for any application which involves exposing a substrate to one or more gaseous substances, such as chemical vapor deposition processes.

Unless otherwise explicitly noted or required by context (for example, by the specified relationship between the orientation of certain components and gravity), the term "over" generally refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention are illustrated and described with a particular orientation for convenience; and unless indicated specifically, such as by discussion of gravity or weight vectors, no general orientation with respect to gravity should be assumed. For convenience, the following coordinate system is used: the z-axis is perpendicular to the output face of the deposition head, the x-axis is parallel to the primary motion direction (in the plane of the output face), and the y-axis is perpendicular to the primary motion axis (in the plane of the output face). Roll, pitch, and yaw are as used herein have their commonly understood definitions. To facilitate interpretation of relative motion and degrees of freedom, the following clarifications are provided. Roll is the rotation about an axis parallel to the primary motion axis (x-axis). Pitch is the rotation about the y-axis in the plane of the output face of the delivery device and perpendicular to the primary motion axis. Yaw is the rotation about the z-axis which is normal to the output face of the delivery device.

An ALD process accomplishes thin-film growth on a substrate by the alternating exposure of two or more reactive materials, commonly referred to as precursors, either in time or space. A first precursor is applied to react with the substrate. The excess of the first precursor is removed and a second precursor is then applied to react with the substrate surface. The excess of the second precursor is then removed and the process is repeated. In all ALD processes, the substrate is exposed sequentially to a series of reactants that react with the substrate. The thickness of the ALD (and SALD) deposited thin-films is controlled by the number of ALD cycles to which the substrate is exposed, where a cycle is defined by the exposure to the minimum required reactant and purge gas flows to form the desired thin-film composition. For example, in a simple design, a single cycle can provide one application of a first reactant gaseous material G1 and one application of second reactant gaseous material G2. In order to effectively achieve repeated cycles, SALD requires either motion of the substrate past the deposition head or the development of complex equipment such that the delivery head with its gas connections, can be moved relative to the substrate. Thin-films of appreciable thickness can be accomplished by either 1) using a deposition head containing a sufficient number of gas distribution cycles and moving the substrate (or the deposition head) in a unidirectional motion relative to the deposition head (or substrate) or 2) using a deposition head with a limited number of cycles and using relative reciprocating motion.

In order to effectively use an SALD deposition head for thin-film deposition, it is commonly employed within a larger SALD system, or apparatus. Typically, such systems are specifically designed to deposit thin films on a particular type of substrate (for example, either rigid or flexible). Furthermore, SALD systems typically utilize a singular motion profile type that is chosen as a result of the design of the deposition head and the type of substrate being coated. In many cases, SALD systems are further designed for a specific application, and as such are configured to coat a single material at a given thickness on a substrate having a particular form factor.

As known by one skilled in the art, each SALD system requires at least three functional elements in order to effectively deposit a thin-film, namely a deposition unit, a substrate positioner and a means of relative motion. To date, the specific design of each functional element has generally differed from system to system. As will be described, preferred embodiments of the SALD systems of the present invention are modular in nature, and as such includes a range of components of differing design that can be exchanged to perform the function of a particular functional element within the novel SALD platform. The design and advantages of specific components useful in a range of SALD systems, and design and advantages of inventive elements and configurations of the novel modular SALD platform of the present invention will be better understood with respect to the Figures.

As shown in schematic block diagram of FIG. 1, SALD system 200 of the present invention is preferably one in which a substrate 97 is moved relative to a fixed deposition unit 210. As such, substrate 97 is positioned over the output face 134 of a deposition unit 210 by substrate positioner module 280, and relative motion between the substrate 97 and the deposition unit 210 is accomplished by motion of the substrate positioner module 280 using relative motion means 270, which can also be referred to as a motion controller or a motion control means. The deposition unit 210, substrate positioner module 280 and relative motion means 270 are functional elements of deposition subsystem 205 of SALD system 200. In various embodiments of the present invention, the deposition unit 210 can be a single deposition head 30 or can be a deposition unit that include an array of deposition heads 30. The relative motion means 270 interacts with the substrate positioner module 280 to move the substrate 97 relative to the deposition unit 210.

The substrate positioner module 280 is preferably an interchangeable substrate positioning module, with the modular system having multiple substrate positioning modules that can be easily exchanged into the SALD system 200, where the different substrate positioning modules are configured to handle different types of substrates 97 and different substrate form factors.

Many types of substrates can be coated with the SALD system 200. The substrates 97 used in the present invention can be any material that acts as a mechanical support for the subsequently coated layers. The substrate 97 can include a rigid material such as glass, silicon, or metals. The substrate can also include a flexible material such as a polymer film or paper. Useful substrate materials include organic or inorganic materials. For example, the substrate can include inorganic glasses, ceramic foils, and polymeric materials. The thickness of substrate 97 can vary, typically from about 25 µm to about 1 cm. Using a flexible substrate 97 allows for roll processing, which can be continuous, providing economy of scale and economy of manufacturing relative to flat or rigid supports.

In some example embodiments, the substrate 97 can include a temporary support or support material layer, for example, when additional structural support is desired for a temporary purpose, e.g., manufacturing, transport, testing, or storage. In these example embodiments, the substrate 97 can be detachably adhered or mechanically affixed to the temporary support. For example, a flexible polymeric support can be temporarily adhered to a rigid glass support to provide added structural rigidity during the deposition process. The glass support can be removed from the flexible polymeric support after completion of the manufacturing process. The substrate 97 can be bare indicating that it contains no substantial materials on its surface other the material from which it is composed. The substrate 97 can include various layers and patterned materials on the surface.

The relative motion means 270 is adapted to connect to the interchangeable substrate positioner modules, and as such, the relative motion means 270 and the interchangeable substrate positioner modules preferably contain appropriate mating features. The substrate positioner module 280 is designed to position the substrate 97 in the x- and y-directions relative to the output face 134 of the deposition unit 210. The SALD system 200 may also include a secondary substrate positioner (not shown) which is designed to control the position of the substrate 97 in the z-direction.

In various configurations, the substrate 97 can be attached to a backer device during deposition. The backer device can be used as heat source for the substrate, or to stiffen otherwise flexible substrates. A backer that is temporarily attached to the substrate, by vacuum for example, is intended to move with the substrate during relative motion between the substrate and a fixed deposition head. The backer attachment can provide greatly increased rigidity and flatness to flexible substrates. A backer device useful in the present invention can be larger than the substrate, as might be used to stabilize piece-parts of flexible substrate or approximately the same size as the substrate, or significantly smaller than the substrate when the substrate is rigid and self-supporting. As used herein, the "substrate unit" refers to either the substrate 97 alone or a substrate 97 with an attached backer device; the substrate unit has relative motion relative to the deposition unit 210.

Figure 2C:
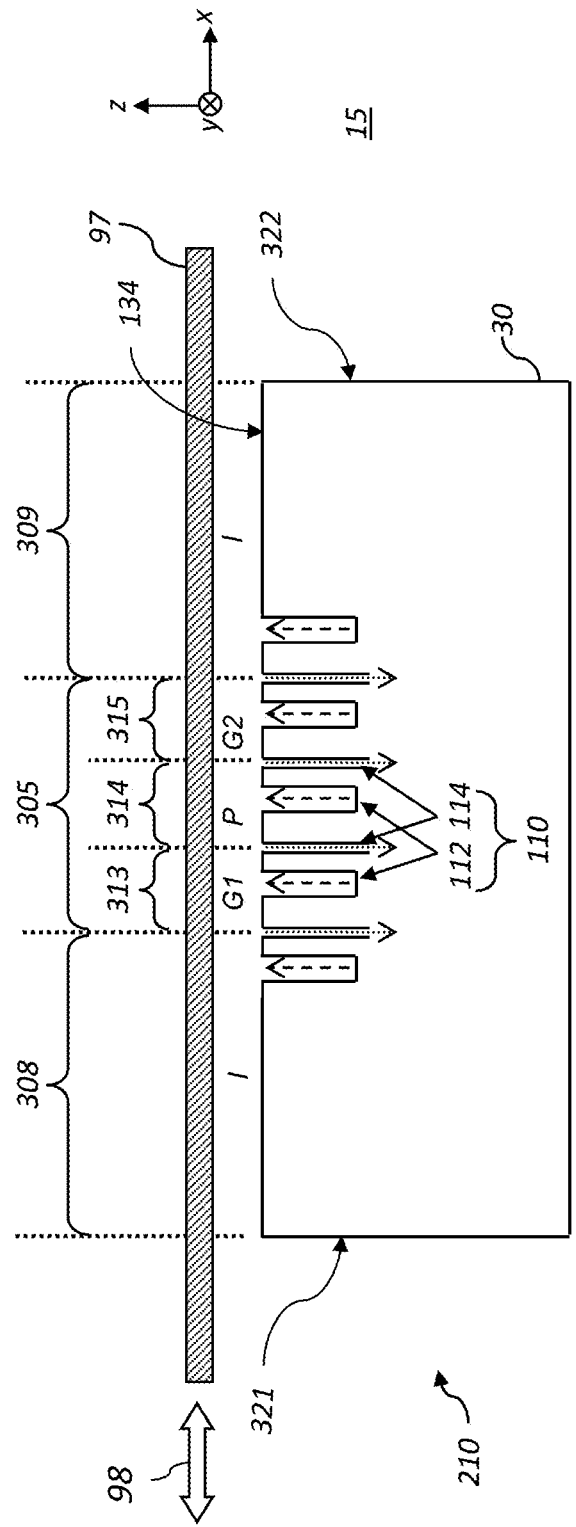

The deposition unit 210 can use any type of SALD deposition head that is known in the art. FIGS. 2A-2C illustrate deposition heads 30 that are configured to simultaneously supply a plurality of gaseous materials from the output face in different gas zones within a deposition zone 305. In all three figures, the deposition zone 305 contains the necessary gas zones for a single two-step ALD deposition cycle. Moving from left to right within the deposition zone 305, there is a first reactive gas zone 313 (G1) followed by an inert gas purge zone 314 (P), and a second reactive gas zone 315 (G2). As the relative motion means 270 (FIG. 1) moves the substrate 97 relative to the deposition head 30 (the x-direction being the primary motion direction as indicated by motion arrow 98), a particular location on the substrate 97 sees the above sequence of gases which results in ALD deposition. Deposition heads 30 of the present can include a deposition zone 305 with gas zones for any number of ALD deposition cycles, the single ALD cycle illustrated is for clarity of understanding.

The SALD systems of the present invention can use any deposition head geometry so long it has the required gas delivery to form gas zones between the deposition head 30 and the substrate 97 in the required order to accomplish an ALD cycle, as illustrated by the simplified deposition head 30 of FIG. 2A. In preferred embodiments, the reactive gases (G1 and G2, for example) have little or no intermixing to avoid a CVD component during film deposition or gas phase reactions. The purge zone 314 (P) serves to separate the reactive gases G1, G2 and allows for the removal of any reaction byproducts from the substrate surface as it moves through the purge zone 314.

A single deposition cycle (moving from left to right) is defined by an inert gas flow I, followed by a first reactive gas flow G1, followed by an inert purge gas flow P, and lastly by a second reactive gas flow G2. The deposition zone 305 has a deposition zone length that spans the distance from the start of the first reactive gas zone to the end of the last reactive gas zone (e.g., from the first reactive gas zone 313 to the second reactive gas zone 315 in FIG. 2A).

The deposition heads 30 illustrated in FIGS. 2A-2C, have extended inert zones 308, 309 on either side of the deposition zone 305. The first inert zone 308 has a first inert zone length that spans the distance from the left edge 321 of the deposition head 30 to the boundary of the first reactive gas zone 313. The second inert zone 309 has a second inert zone length that spans the distance from the boundary of the second reactive gas zone 315 to the right edge 322 of the deposition head 30. The extended inert zones 308, 309 isolate the deposition zone 305 from the external environment 15 and enable the deposition head 30 to coat substrates 97 that are substantially longer than the length of the deposition head 30 without exposing the growth region to the external environment 15. Deposition heads of the prior art are typically operated within a larger system where the external environment is controlled to be inert, under vacuum, or both. In preferred embodiments of the present invention, the deposition head 30 can be used at atmospheric pressure without any additional environmental controls for the external environment 15. One of the advantages of the present invention is that the deposition head 30 and SALD system 200 containing it can be used to coat on substrates 97 whose length is much larger than the length of the deposition zone 305. A further advantage of some embodiments of the present invention is the ability to control the environment of the region of the substrate being actively coated during deposition. Additionally, the relatively small deposition head size allows for lower cost manufacturing of the deposition head.

It is known that ALD is self-limiting, meaning that when all available sites on a substrate surface have reacted with a precursor there is no further reaction during that half-step. When both half-reactions in a deposition cycle have sufficient time and available precursor to reach this state, it is said that the ALD cycle has reached "saturation". ALD depositions done in these conditions are by definition, saturated ALD, and continued exposure to the precursors does not change significantly the deposition amount. In SALD, the substrate velocity and length of reaction zones determine the exposure time to a give precursor. For a given velocity, there is a minimum zone length required to reach saturation (i.e., a "saturation length") and zone lengths longer than the saturation length do not add film thickness during material deposition. SALD systems of the present invention can be used in both saturated and sub-saturated conditions. One advantage of the present invention is that sub-saturated growth can still be deterministic, since each point on the substrate 97 will see the same concentration of precursors for a time which is set by the substrate velocity and motion profile.

The motion arrow 98 indicates one known motion of the substrate 97 useful in SALD which is to move the substrate 97 in a smooth oscillating, or reciprocating, motion through the entire deposition zone 305 such that the substrate "sees" the required number of cycles to produce the desired coating thickness (as discussed above). In preferred embodiments of the present invention the substrate motion is controlled such that the region being actively coated is prevented from experiencing the external environment during coating. This has the advantage of avoiding contamination of the thin-films during growth by preventing exposure to any reactive species or dust particulates or other contaminates that may be present in the external environment outside of the controlled environment defined by the region between the deposition head 30 and the substrate 97.

The deposition head 30 of FIG. 2B illustrates an embodiment where one or more of the gas zones use a transverse arrangement, such as that disclosed in the aforementioned commonly-assigned U.S. Pat. No. 7,456,429 (Levy et al.), entitled "Apparatus for atomic layer deposition." In a transverse flow arrangement, the flow of gases during deposition is orthogonal, or transverse, to the direction of substrate motion and is exhausted either out the edges of the deposition head 30, or into exhaust slots along the perimeter of the deposition head 30. As illustrated, the deposition head 30 has gas slots 110 (i.e., output slots 112) that are configured to supply the gases into their corresponding gas zones. In other embodiments, the deposition head 30 provides gas to the elongated parallel gas zones through an array of orifices, rather than through the illustrated output slots 112 (elongated channels).

The deposition head 30 of FIG. 2C illustrates a preferred gas bearing deposition head 30 of the present invention. The principles and design of gas bearing deposition heads 30 has been described in detail in the aforementioned U.S. Patent Application Publication 2009/0130858, as well as in commonly-assigned U.S. Pat. No. 7,572,686 (Levy et al.) and entitled "System for thin film deposition utilizing compensating forces." As shown in FIG. 2C, an exemplary deposition unit 210 includes a deposition head 30 that operates on a vacuum-preloaded gas bearing principle having an output face 134 (facing upward) having gas slots 110 which provide gases into the gas zones and exhaust gases from the gas zones. Gases are provided into the gas zones by spatially separated elongated output slots 112 (extending in the y-direction). Each gas zone includes a corresponding output slot 112. Adjacent exhaust slots 114 remove (or exhaust) gas from the gas zones. The exhaust slots 114 are positioned to define the boundaries of the various gas zones. As illustrated, the gas zones are equivalent to those of FIGS. 2A and 2B. The output slots 112 can more generally be referred to as "output openings," and the exhaust slots 114 can more generally be referred to as "exhaust openings."

In these preferred embodiments wherein the deposition head 30 operates using a gas bearing principle the substrate 97 is positioned above the output face 134 of the deposition head 30 and is maintained in close proximity to the output face 134 by an equilibrium between the pull of gravity, the flow of the gases supplied to the output face 134 through the output slots 112, and a slight amount of vacuum at the exhaust slots 114. While the gas openings in this example are gas slots 110 (also referred to as gas channels) that extend in the y-direction, one skilled in the art will recognize that the gas openings could also have other geometries, such as a row of nozzles or circular orifices, so long as the proper gases are delivered into and exhausted from the gas zones between the deposition head and the substrate.

As shown in FIG. 2C, the gases are introduced and exhausted in alternating output slots 112 and exhaust slots 114 in the output face 134 of the deposition head 30. The flow of gases between the output slots 112 during deposition is primarily in the direction of substrate travel (forward and backward) toward the adjacent exhaust slots 114. As discussed earlier, the region that spans the reactive gas zones can be referred to as the deposition zone 305, which is preferably surrounded by two inert zones 308, 309. The individual gas zones within the deposition zone 305, where the substrate 97 is exposed to each gas, generally extend outward from the corresponding output slot 112 to the two adjacent exhaust slots 114 as illustrated for the first reactive gas zone 313, the purge zone 314, and the second reactive gas zone 315. In the illustrated configuration, the extended inert zones 308, 309 extend from the inert gas output slots 112 to the edges of the deposition head 30. In alternative embodiments, the extended inert zones 308, 309 can include additional output slots 112 or other gas supply features. Additionally, the extended inert zones 308, 309 can include exhaust slots 114, or other exhaust features, to provide additional protection/separation from the external environment 15.

Using any of the embodiments of deposition head 30 of FIGS. 2A-2C, an SALD deposition process can be accomplished by oscillating the position of the substrate 97 across the deposition head 30 (in the in-track direction indicated by the motion arrow 98) for the number of cycles necessary to obtain a uniform deposited film of the desired thickness for the given application.

Figure 3A:
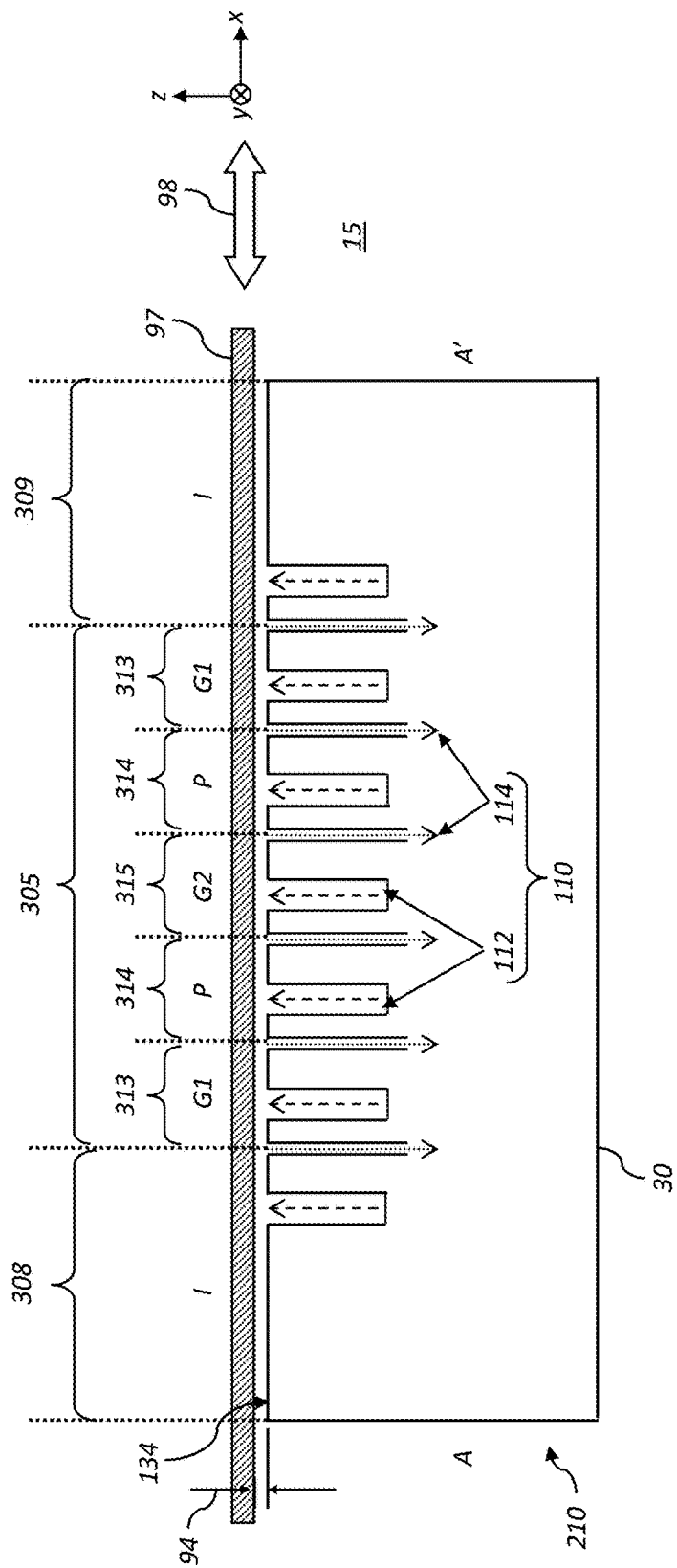
FIG. 3A is a cross-sectional side view of an alternative embodiment of an SALD deposition head having 1.5 ALD cycles.
Figure 3B:
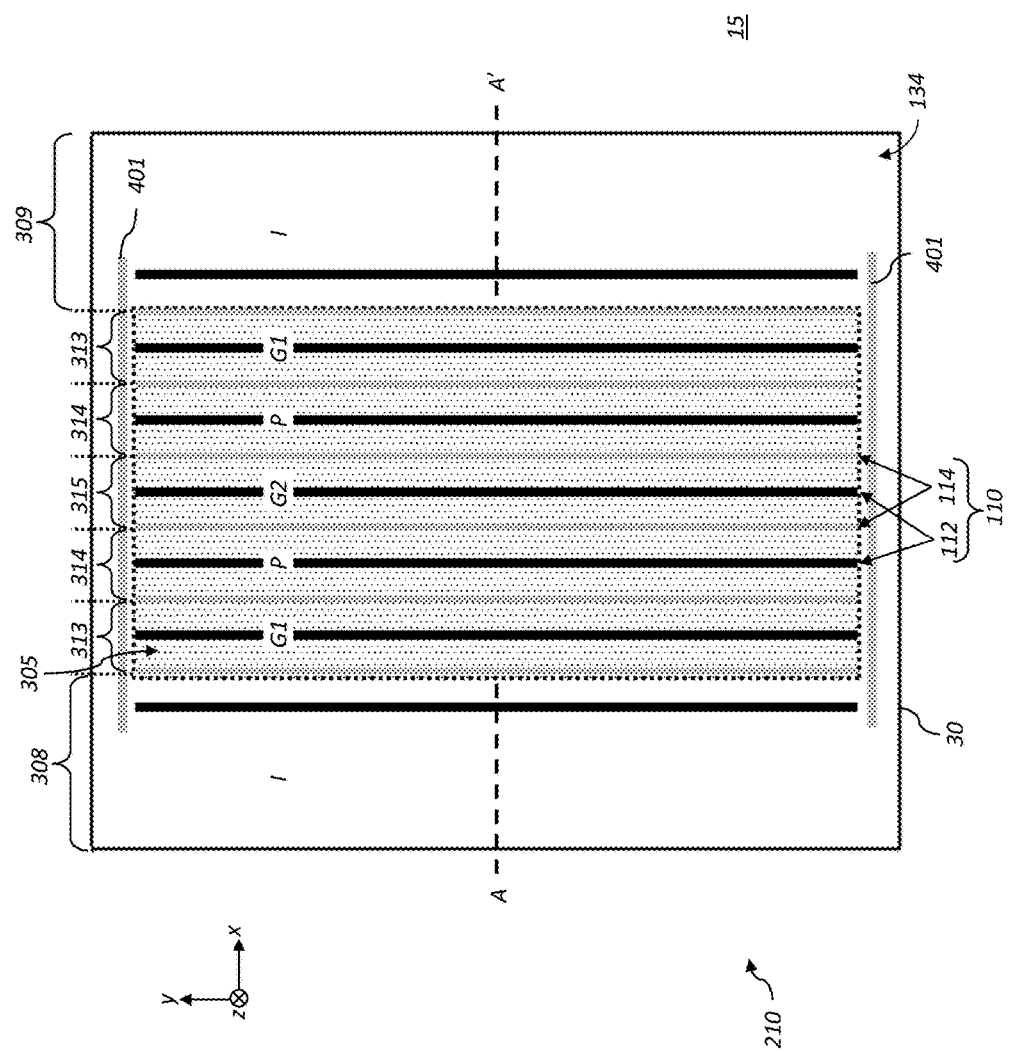
FIG. 3B is a plan view of the SALD head of FIG. 3A.

FIG. 3A is a cross-sectional view of a deposition head 30 illustrating a preferred embodiment of the present invention where the deposition zone 305 is arranged to be symmetric, so that as the substrate 97 is moved relative to the deposition head 30 a position can "see" a full cycle exposure in either a forward or reverse direction. FIG. 3B illustrates a plan view corresponding to the cross-sectional view of FIG. 3A, where the cross-sectional view is taken along the line A-A' of the plan view. In common parlance, the deposition head 30 illustrated in FIG. 3A-3B can be referred to a "one-and-a-half cycle head" or a "1.5 cycle head." Moving from left-to-right through the deposition zone 305, the substrate 97 is exposed to (in order) a first reactive gas zone 313 where the substrate is exposed to a first reactive gas G1, an inert purge zone 314 where the substrate is exposed to an inert purge gas P, a second reactive gas zone 315 where the substrate is exposed to a second reactive G2, another inert purge zone 314 where the substrate is exposed to the purge gas P, and another first reactive gas zone 313 where the substrate is exposed to the first reactive gas G1. Moving in the reverse direction from right-to-left through the deposition zone 305, the substrate 97 is exposed to the same sequence of gases as in the forward (left-to-right) direction, namely the first reactive gas G1, the inert purge gas P, the second reactive gas G2, the inert purge gas P, and the first reactive gas G1. The advantage of this symmetry is that feeding the substrate 97 from left-to-right or right-to-left results in equivalent exposure, and entrance and exit sides of the deposition head 30 depend of the direction of relative motion of the substrate 97 not the design of the deposition head 30.

As with the previous embodiments, the gas zones (or regions) are between the substrate 97 and the deposition head 30. The labels in FIG. 3A are placed above the substrate for clarity and to further emphasize the small working distance 94 between the process-side of substrate 97 and the output face 134 of the deposition head 30 enabled by the use of a vacuum-preloaded gas bearing deposition head 30. As illustrated in the plan-view of FIG. 3B, in addition to the output slots 112 (shown as black lines) and the exhaust slots 114 (shown as gray lines) in the deposition zone 305 (shown as a shaded area), there are additional output slots 401 orthogonal to the gas slots 110 in the deposition zone 305. The additional gas output slots 401 provide inert gas to the cross-track edge region of the deposition head 30, providing further isolation of the deposition zone 305 from the external environment 15.

The exemplary gas bearing deposition head 30 of FIG. 3A has gas slots 110 corresponding to 1.5 ALD cycles to provide the proper sequence of gas exposure in the forward and reverse directions. As the substrate 97 is oscillated back and forth over the deposition head 30, it will provide only a single ALD cycle (one G1 and one G2 exposure) per single direction pass over the deposition head 30, therefore a round trip oscillation provides two ALD cycles. Furthermore, when the second precursor G2 is reactive with the external environment, while the first precursor G1 is not, this arrangement provides additional protection against unwanted reactions involving G2. An example of a precursor pair that would benefit from this arrangement is water and trimethylaluminum (TMA), where water is the non-reactive precursor G1 and TMA is the highly reactive precursor G2.

The deposition head 30 is preferably constructed of a material which does not react with the precursor gases and can withstand the required temperatures without significant deformation. One preferable material is stainless steel. It is recognized that other materials can also be used, but differential thermal expansions must be kept low to prevent distortions. As described, the deposition head 30 delivers multiple reactive and inert process gasses through output face 134. Connection of the various gas sources to the deposition head 30 can be accomplished using individual pipe or tubing connections distributed about the periphery of the deposition head 30. In an exemplary configuration, commercially available fittings, such as Swagelok VCR series components, are used for gas source connections. In preferred embodiments, the gases are supplied to the deposition head 30 via a manifold.

A relatively clean external environment is useful to minimize the likelihood of contamination, but is not necessary. Full "clean room" conditions or an inert gas-filled enclosure can be used in systems of the present invention, however preferred embodiments do not be require control of the external environment and are advantaged for that reason.

The apparatus of the present invention is advantaged in its capability to perform deposition onto a substrate 97 over a broad range of temperatures, including room temperature, or near-room temperature, in some embodiments. The apparatus of the present invention can operate in a vacuum environment, but is particularly well suited for operation at or near atmospheric pressure. In preferred embodiments, the SALD process can be performed at or near atmospheric pressure and over a broad range of ambient and substrate temperatures, preferably at a temperature of under 300° C.

Deposition heads 30 in exemplary embodiments of the present invention utilize multiple gaseous materials to perform SALD, and in preferred embodiments also utilize a vacuum source to exhaust gases away from the substrate 97. The deposition heads 30 can be more generally referred to as gas delivery heads, and are used to deliver one or more gaseous substances onto the surface of the substrate 97. While the exemplary embodiments are described in the context of SALD systems, those skilled in the art will recognize that the deposition heads 30 of the present invention can also be used for any application which involves exposing a substrate 97 to one or more gaseous substances, such as chemical vapor deposition processes.

For ease of maintenance and use, some configurations utilize a manifold to provide the gases and optional vacuum source to the deposition head. The manifold advantageously decouples the complex gas fittings from the design of the deposition head, and additionally provides a mounting mechanism to easily and reproducibly position the deposition head in the SALD system 200. Furthermore, there are cost advantages of keeping the size of individual deposition heads 30 small. Exemplary configurations provide the advantage of using a single manifold to connect multiple deposition heads 30, which can be precisely oriented relative to each other and the overall SALD system 200. The use of multiple deposition heads 30 within the SALD system 200 enables wider coatings, multilayer configuration, and manufacturing simplicity where a single deposition head 30 can be utilized in a variety of SALD system configurations 200 by using an appropriate manifold.

Figure 4:
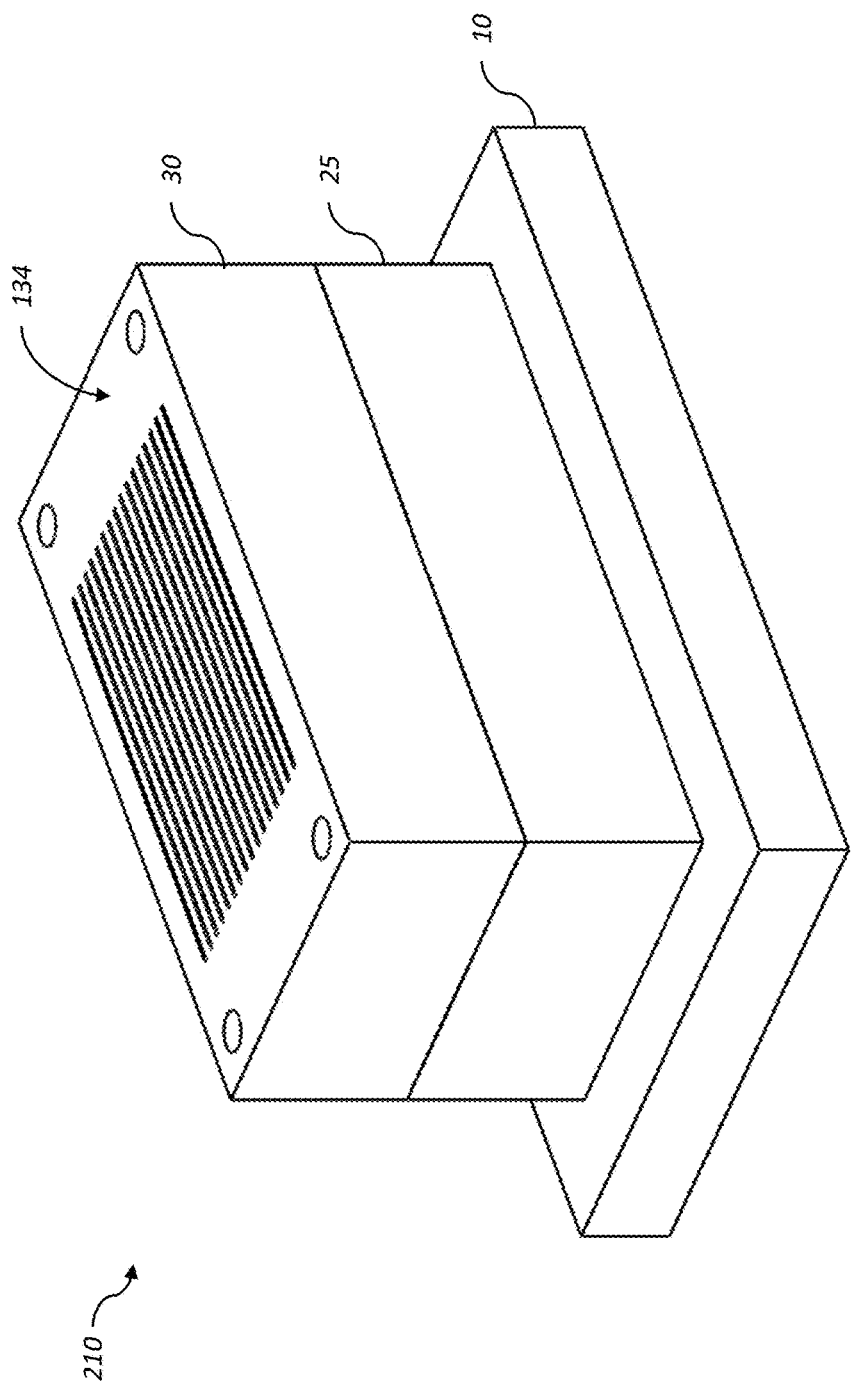
FIG. 4 illustrates a deposition head mounted on a fixed manifold.

FIG. 4 illustrates a deposition unit 210 including a deposition head 30 mounted to a manifold 25. The manifold 25 is mounted on, or made an integral part of, a machine base 10. Output face 134 of the deposition head 30 is accessible for bringing a substrate surface to be coated into close proximity with the output face 134. The manifold 25 and the deposition head 30 are co-designed to provide various advantageous functional features.

Figure 5:
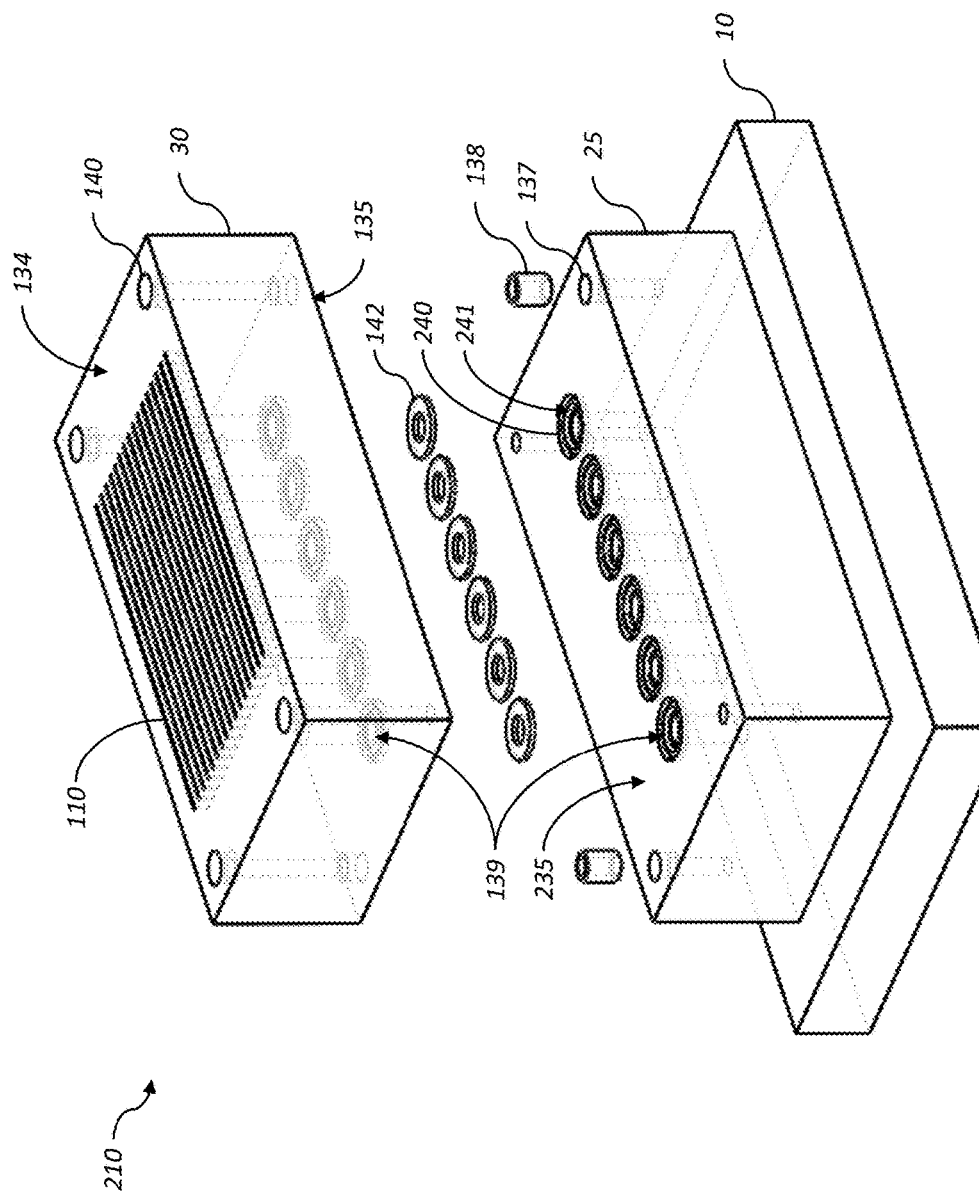
FIG. 5 is an expanded view of a manifold and deposition head illustrating alignment and sealing features according to an exemplary embodiment.

As shown in FIG. 5, the manifold 25 has an attachment face 235 with features that correspond to features of mounting face 135 of the deposition head 30. In the illustrated configuration, the mounting face 135 is the side of the deposition head 30 opposite to the output face 134. For the purposes of periodic maintenance, such as cleaning, it is an advantage of the illustrated configuration that the deposition head 30 can be removed from the manifold 25, serviced or exchanged, and reinstalled in a repeatable position. In a preferred embodiment, the mounting face 135 and output face 134 of the deposition head are parallel planes produced with an accurately controlled separation with a tolerance of less than 50 μm, or more preferably a tolerance of less than 5 μm. This dimensional control enables the deposition head 30 to be exchanged without a change in the elevation of the output face 134 of the deposition head 30 in the SALD system 200.

In some embodiments, the location of deposition head 30 is controlled by including nesting features, such as pockets or edges, that are incorporated into the mounting face 135 that engage with corresponding features in the attachment face 235 of the manifold 25. In the exemplary configuration illustrated in FIG. 5, the mounting face 135 and attachment face 235 have mating counterbores 137 for receiving alignment pins 138. In some configurations, the alignment pins 138 can be hollow such that fasteners (e.g., socket head cap screws) can be located concentric with, and pass through the alignment pins 138 to provide retention of the aligned deposition head 30. Additional fasteners may be distributed about the mounting face 135 and attachment face 235 to provide adequate stabilization of the interface between the deposition head 30 and the manifold 25. It is preferred that the retention fasteners be accessible from the output face 134 of the deposition head 30 to facilitate removal, but additional fasteners inserted from the manifold 25 underside can be used in some arrangements. In some configurations, counterbores 140 for the fasteners are provided in the output face 134 of the deposition head 30 so that the fastener heads do not interfere with the substrate position. The fastener counterbores 140 are located outside the boundaries of the deposition zone, and sufficiently beyond the centerline of the output face 134 so as not to interfere with the delivery and isolation of the multiple process gasses effused from the output face 134. In preferred arrangements, the fastener counterbores 140 are located within the entrance and exit inert zones of deposition head 30.

As described earlier, the deposition head 30 delivers multiple reactive and inert process gasses to gas openings (e.g., gas slots 110) on the output face 134. In the illustrated arrangement, the manifold 25 also serves as a gas distribution manifold between the deposition head 30 and external gas supply systems and vacuum systems. The gas supply systems provide pressurized gaseous materials and will typically include various flow control components (e.g., valves, pressure regulators, flow controls, and bubblers). Preferably, connections to the multiple gas supply systems and vacuum systems are made simultaneously by providing gas connection features on the abutted mounting face 135 of the deposition head 30 and the attachment face 235 of the manifold 25. Gas connections (not shown) are preferably provided on the manifold 25 to connect with external gas supply systems and vacuum systems. Gas passages within the manifold 25 connect the manifold gas ports (i.e., gas connection openings 139) to the gas connections.

Figure 6:
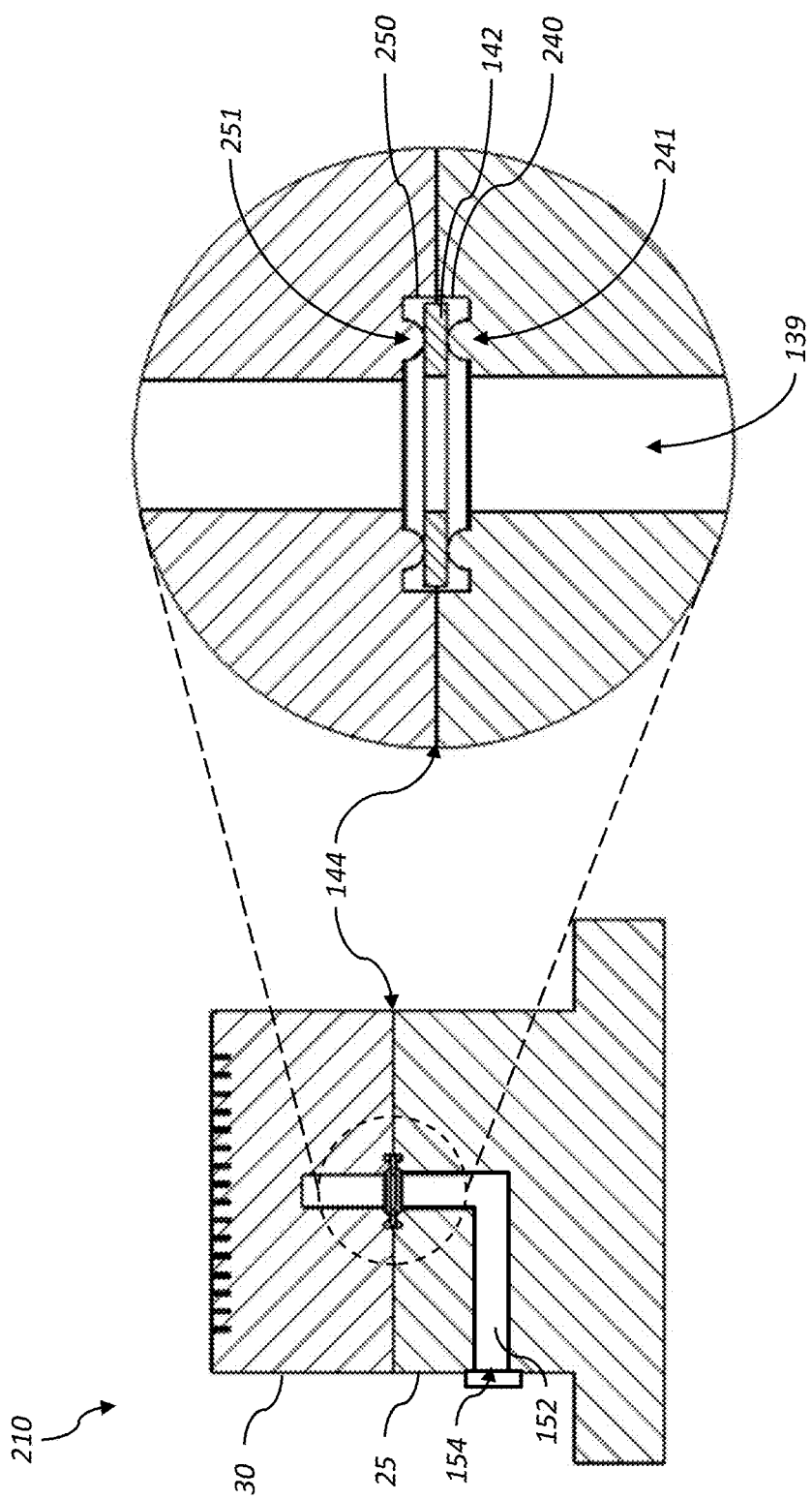
FIG. 6 is a cross-sectional view showing the gas connection and sealing region between the manifold and deposition head of FIG. 5.

The gas flow connections between the gas manifold 25 and the deposition head 30 are advantageously easy to make, reliable, easy to disconnect and standardized so that heads can be swapped out for cleaning and maintenance. In the configuration illustrated in FIG. 5, the gas connections are made using sealing elements 142 in conjunction with the gas connection ports (i.e., gas connection openings 139 with counterbores 240 having annular raised features 241) on the attachment face 235 of the manifold 25 and corresponding gas connection ports (i.e., gas connection openings 139 with counterbores 250 having annular raised features 251 as shown in FIG. 6) on the mounting face 135 of deposition head 30. The as connection ports on the manifold 25 can also be referred to as "manifold gas ports," and the gas connection ports on the deposition head can also be referred to as "deposition head gas ports." Gas passages in the interior of the deposition head 30 connect each of the gas slots 110 on the output face 134 to corresponding gas connection openings 139 on the mounting face 135. Pressurized gaseous materials from the external gas supply systems flow through the connected gas passages in the gas manifold 25 and the deposition head 30, and are output through the corresponding gas slots 110. In some configurations, the same gaseous material is supplied through a plurality of the gas slots 110. In such cases, the gas passages can connect a single gas connection opening 139 to a plurality of gas slots 110. Likewise, for configurations wherein some of the gas slots 110 are connected to a vacuum system to draw exhaust gasses away from the output face 134 of the deposition head 30, the gas passages in the deposition head 30 and the manifold 25 can connect a plurality gas slots 110 to a single gas connection on the manifold 25 which is connected to the vacuum system.

FIG. 6 shows a cross-section through the assembled deposition unit 210 of FIG. 5, illustrating additional details of the gas connection between the manifold 25 and deposition head 30. The gas connection openings 139 in the attachment face 235 (FIG. 5) of the manifold 25 include counterbores 240. Annular raised features 241 are located in the bottom of counterbores 240. Corresponding counterbores 250 with annular raised features 251 are also located in the mounting face 135 (FIG. 5) of deposition head 30. The annular raised features 241, 251 can be ridges having semicircular, triangular, or other contoured cross-section. The counterbores 240, 250 are distributed in an array corresponding to the required number of gas and vacuum connections. In some configurations, multiple deposition head designs are used having standardized array dimensions among the multiple head variations to enable connection to a common manifold 25. Sealing elements, 142 are preferably malleable sealing washers, and are placed in the counterbores 240 at each gas connection opening 139 in manifold 25 when the deposition head 30 is installed. The thickness of the sealing element 142 and the dimensions of the annular raised features 241, 251 are such that each of the sealing elements 142 is compressed and/or swaged when the head retaining fasteners are installed, thus providing sealing and isolation of all mating gas connections. The attachment face 235 of the manifold 25 and the mounting face 135 of deposition head 30 are brought into line-to-line contact 144 by the retaining fasteners thereby providing a deterministic position of the output face 134 of the installed deposition head 30. A gas passage 152 connects each of the gas connection opening 139 in manifold 25 to a corresponding gas connection 154 to connect with an external gas supply system or vacuum system.

Other sealing elements and compatible seat features providing comparable function can be used in accordance with the present invention. An alternative embodiment utilizes annular grooves in either the attachment face 235 of the manifold 25 or the mounting face 135 of deposition head 30 around each gas connection location, in combination with O-rings to provide the seal. The choice of seal material is dependent on the process gas chemical compatibility and overall temperature requirements of the SALD system 200. The sealing elements 142 are preferably made of an elastomeric material or a malleable plastically deformable material. In an exemplary configuration, the sealing elements 142 are plated metallic components.

Figure 7:
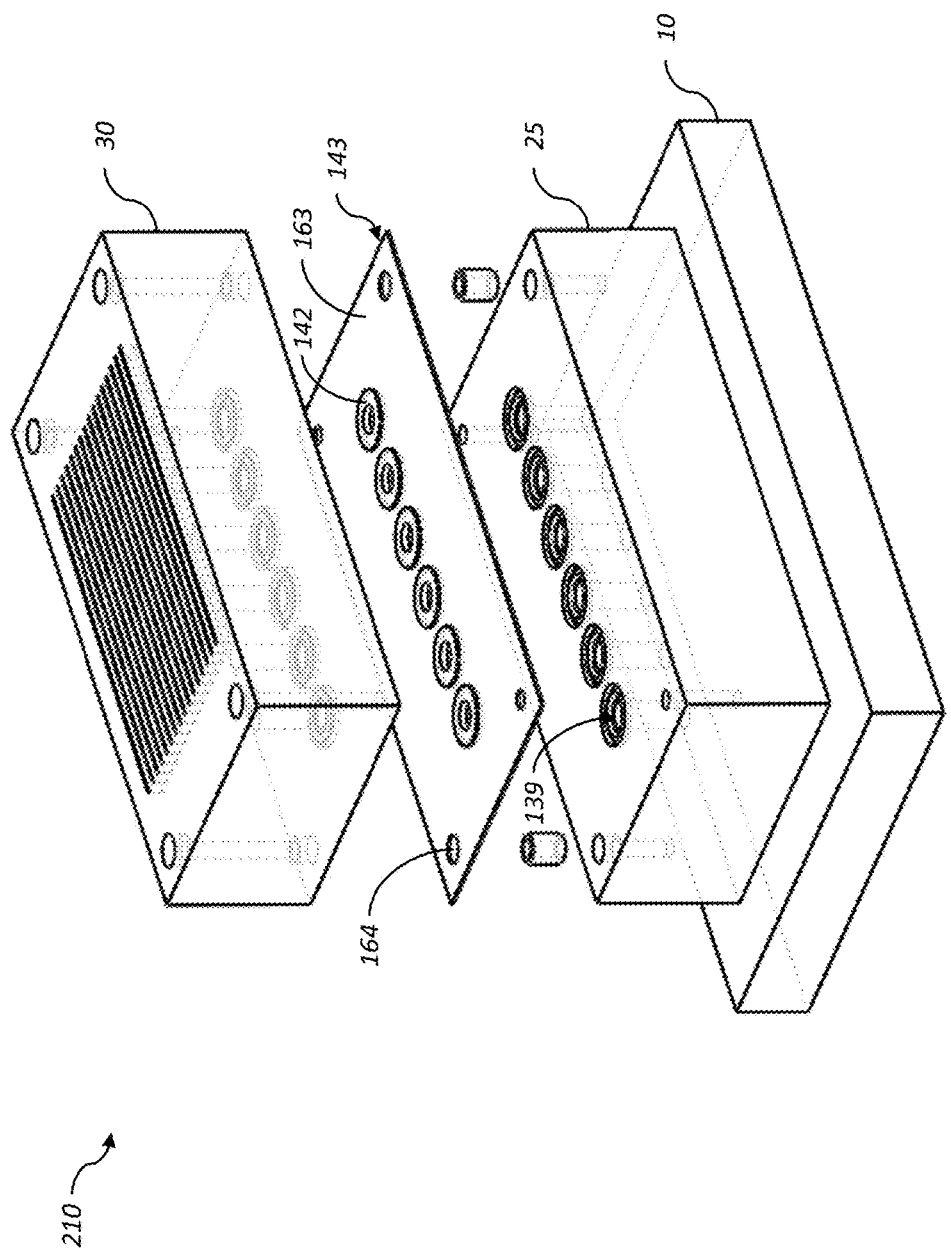
FIG. 7 is an expanded view of a manifold and deposition head illustrating the use of a sealing gasket according to another exemplary embodiment.
Figure 8:
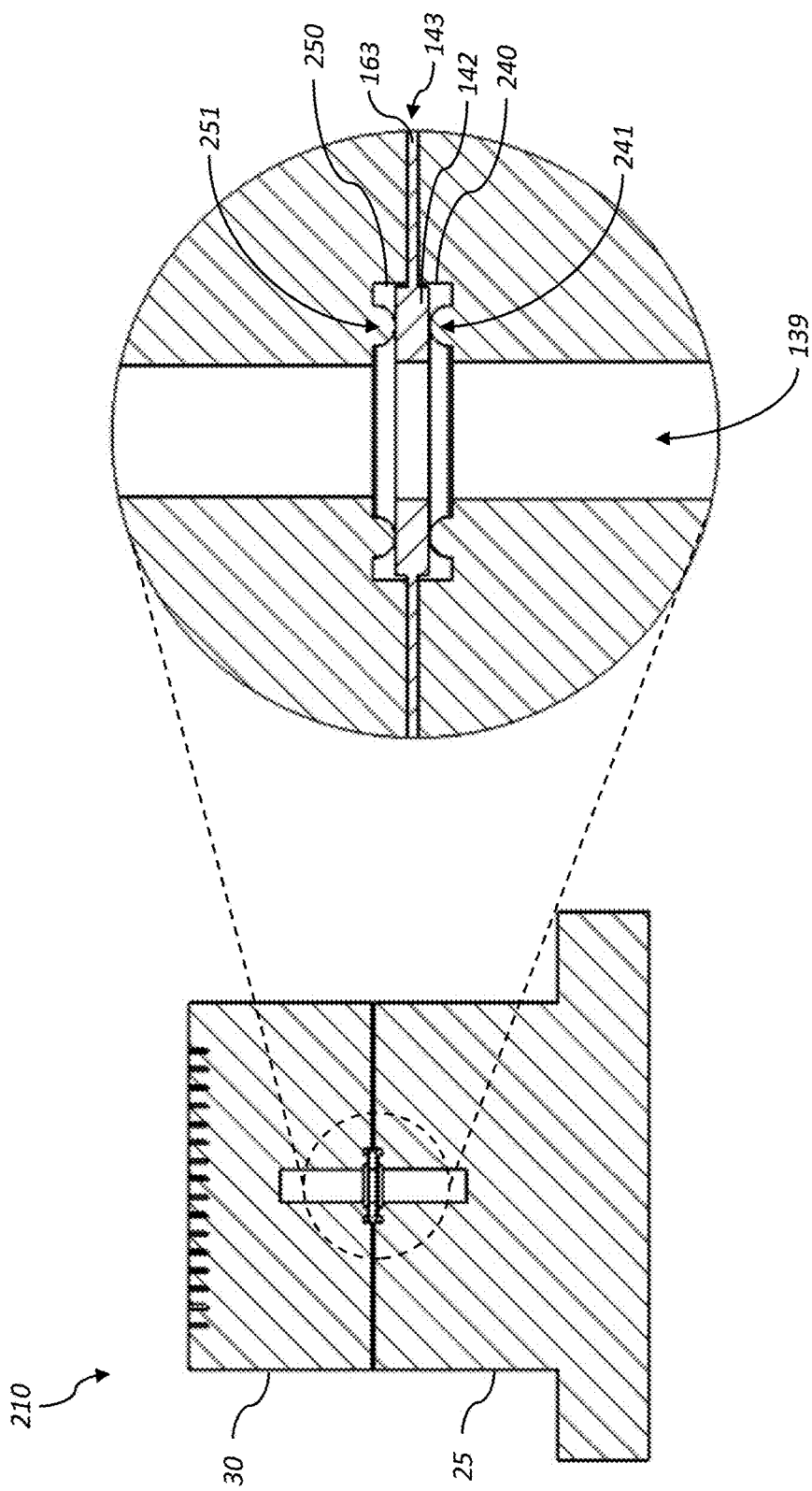
FIG. 8 is a cross-sectional view showing the gas connection and sealing region between the manifold and deposition head of FIG. 7.

A potential issue that could arise with the simultaneous placement of multiple sealing elements 142 in the arrangement of FIG. 5 is that a sealing element 142 could become misplaced, disturbed during assembly, or accidentally omitted. FIGS. 7 and 8 illustrate an alternate configuration that uses a single integrated sealing component 143. As shown, multiple sealing elements 142 are integrated into the integrated sealing component 143 using a carrier element 163, such as a web, between localized sealing elements 142. This provides the advantage of pre-aligning the relative position of the sealing elements 142 and makes it possible to handle the integrated sealing component 143 as a unit. The carrier element 163 can include other features, such as apertures 164 that correspond to the alignment features used to locate the deposition head 30 in the plane of the manifold face (e.g., the alignment pins 138).

Figure 9:
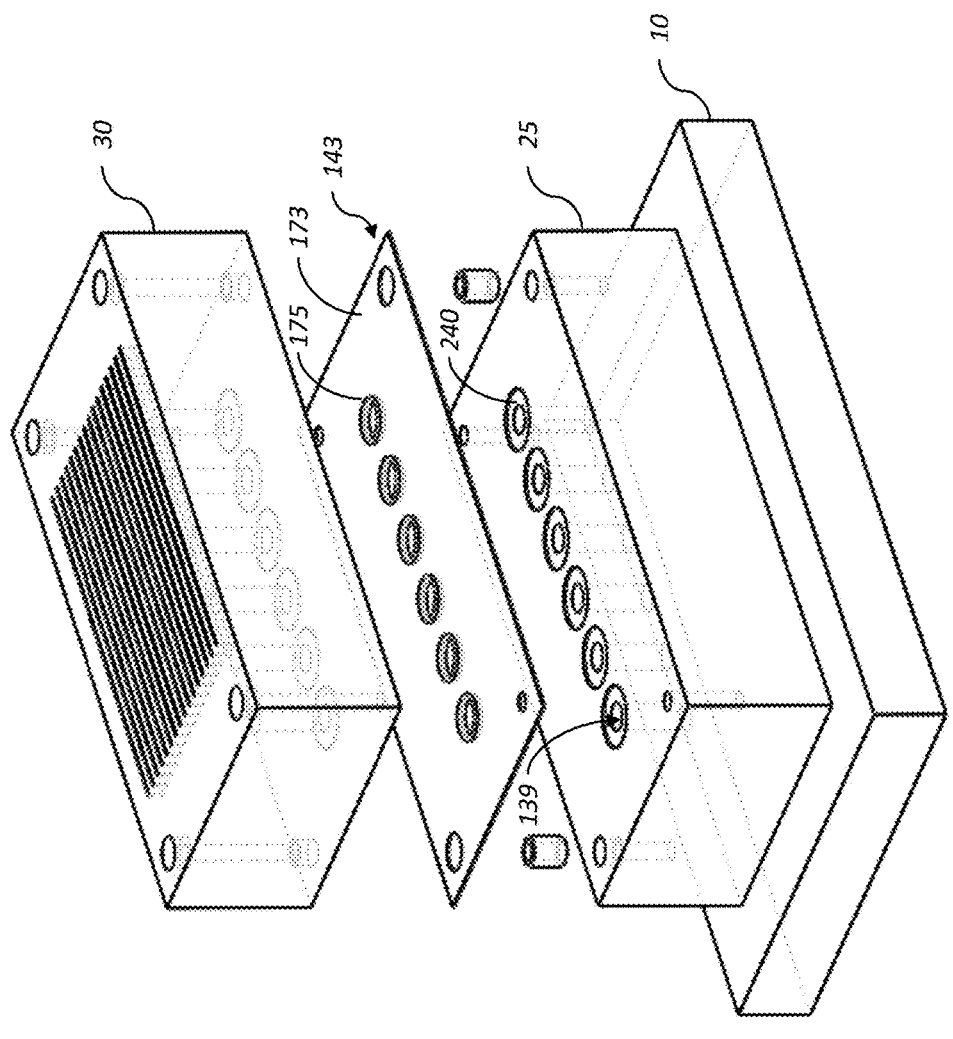
FIG. 9 is an expanded view of a manifold and deposition head illustrating the use of an alternate sealing gasket arrangement according to another exemplary embodiment.
Figure 10:
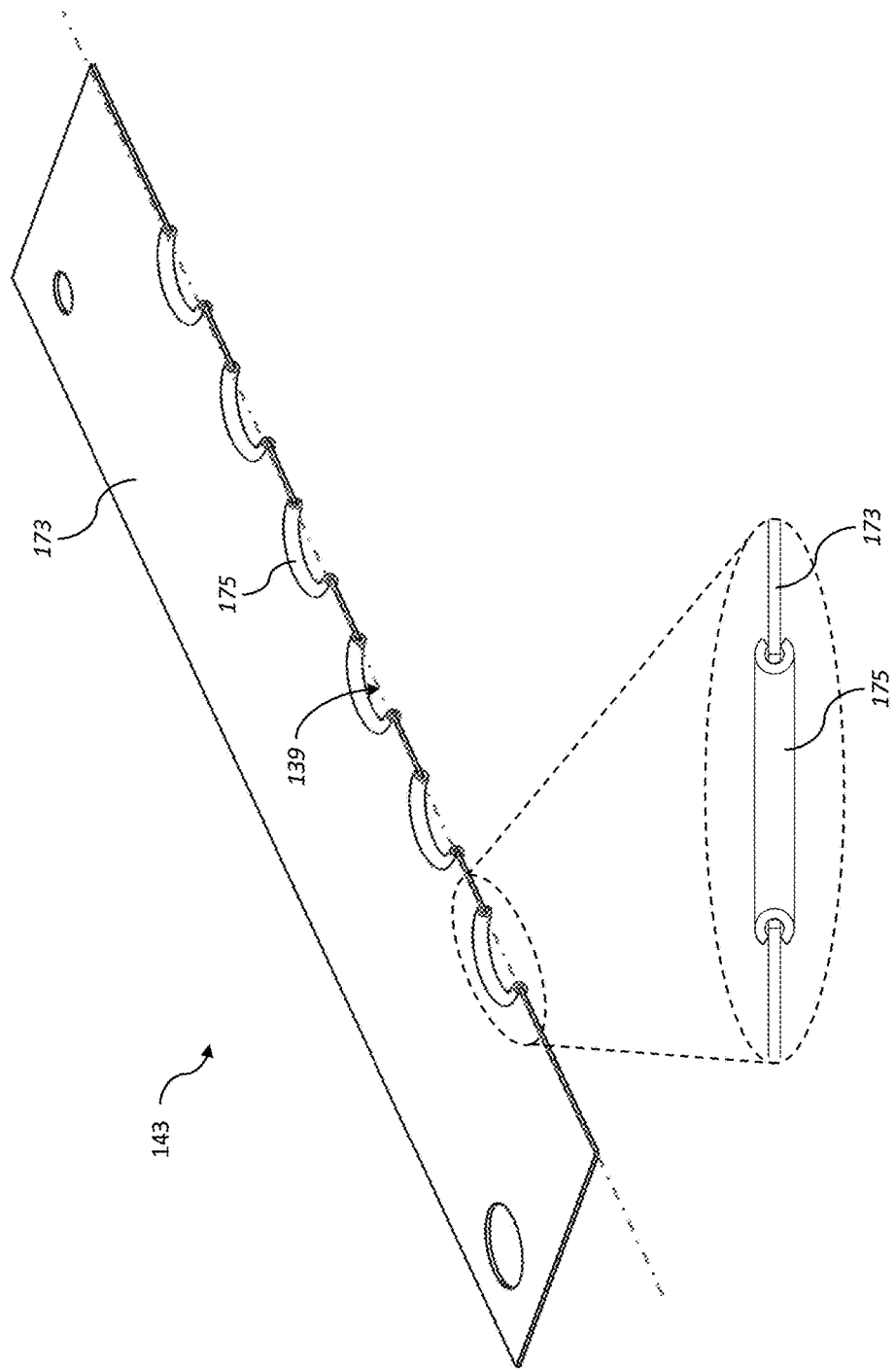
FIG. 10 illustrates additional details of the sealing gasket of FIG. 9.
Figure 11:
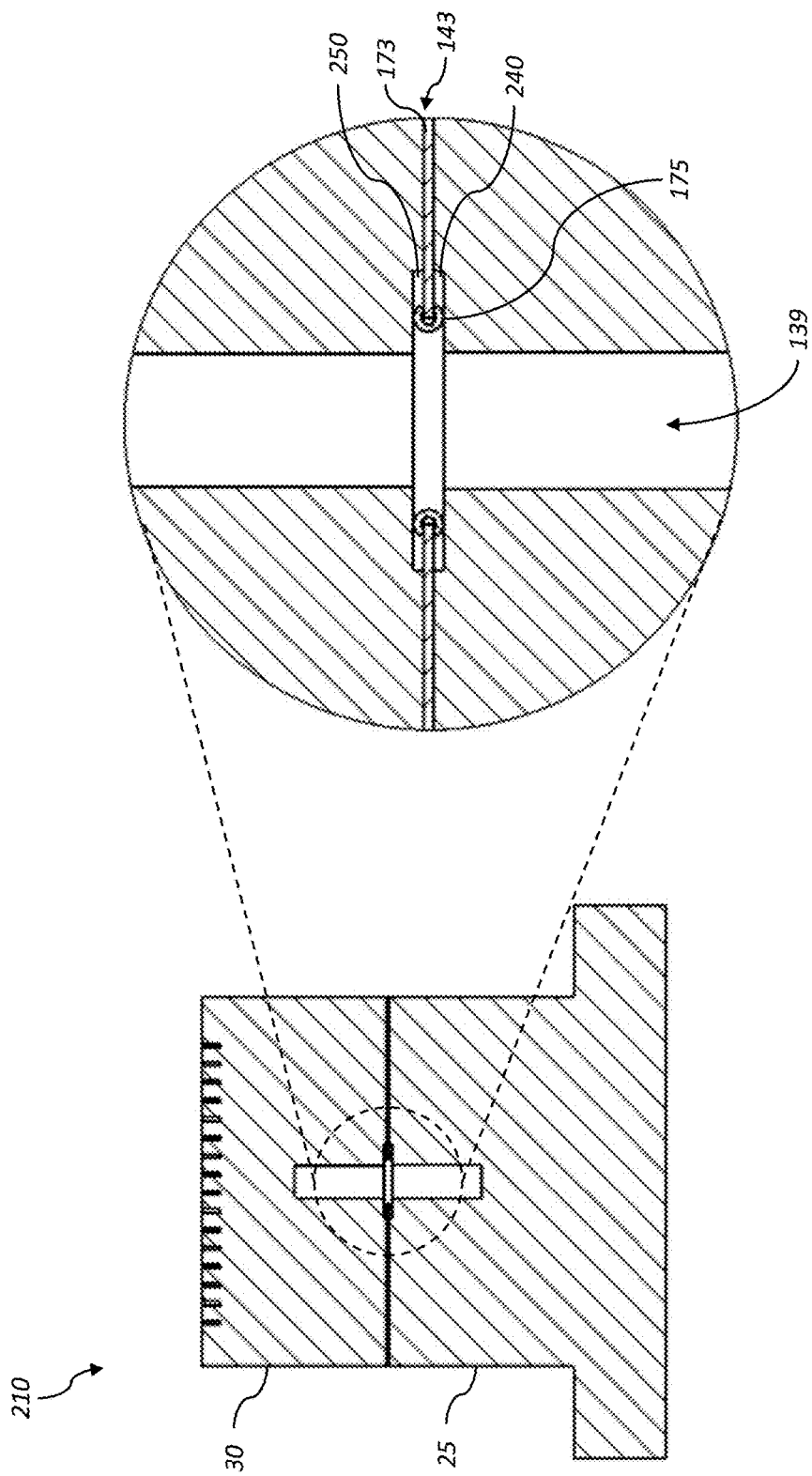
FIG. 11 is a cross-sectional view showing the gas connection and sealing region between the manifold and deposition head of FIG. 9.

In another embodiment illustrated in FIGS. 9-11, the integrated sealing component 143 is a combination of a flat perforated carrier web 173 and compressible sealing rings 175 formed around each gas connection opening 139. In an exemplary configuration, the carrier web 173 is formed (e.g., punched, water jet or laser cut) from metal shim stock, and the sealing rings 175 are molded elastomeric rings that are insert molded to the carrier web 173. Alternatively, all-metallic, high temperature compatible, integrated gaskets can be created by forming a "C" cross section crushable annular sealing ring at each port aperture in the carrier web 173 by a forming processes such as orbital swaging or press forming. FIG. 10 shows a section view through the integrated sealing component 143 showing the carrier web 173 and compressible sealing rings 175 formed around each gas connection opening 139. A close up cut away view is also shown for one gas connection opening 139 in the carrier web 173 with the sealing ring 175 in place. FIG. 11 shows a cross-section through the assembled deposition unit 210 of FIG. 9, illustrating additional details of the gas connection between the manifold 25 and deposition head 30. In this case, the counterbore 240 in the manifold 25 and the counterbore 250 in the deposition head 30 do not need to include the annular raised features 241, 251 (FIG. 6) because the sealing rings 175 provide a similar function.

Figure 12:
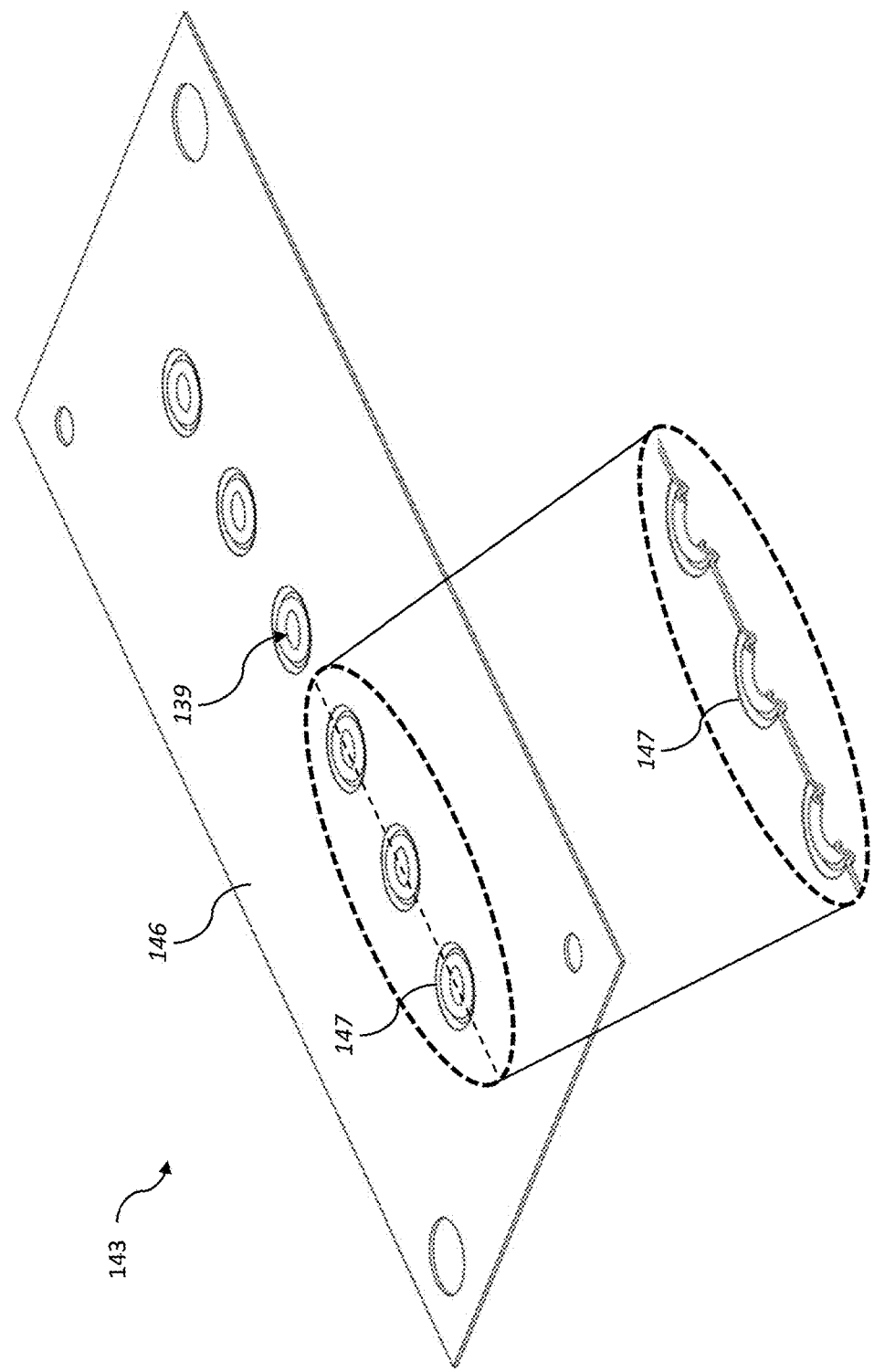
FIG. 12 illustrates a one-piece corrugated metallic according to another exemplary embodiment.

FIG. 12 shows another exemplary configuration of integrated sealing component 143. In this case, the integrated sealing component 143 is a one-piece metallic gasket 146 that includes corrugated sealing surfaces 147 around each gas connection opening 139. To form the one-piece metallic gasket 146, a row of holes corresponding to the gas connection opening 139 in the manifold 25 are formed in an initial punching step. A second forming step then deforms the metal gasket material around each opening to provide the corrugated sealing surfaces 147. When the deposition unit 210 is assembled (in an analogous configuration to that shown in FIG. 11), the corrugated sealing surfaces 147 would be compressed in the counterbores 240 of the manifold 25 and the counterbores 250 of the deposition head 30, thereby sealing around the gas connection opening 139. In an exemplary configuration, the one-piece metallic gasket 146 is a crushable and deformable gasket intended for one-time use.

Figure 13:
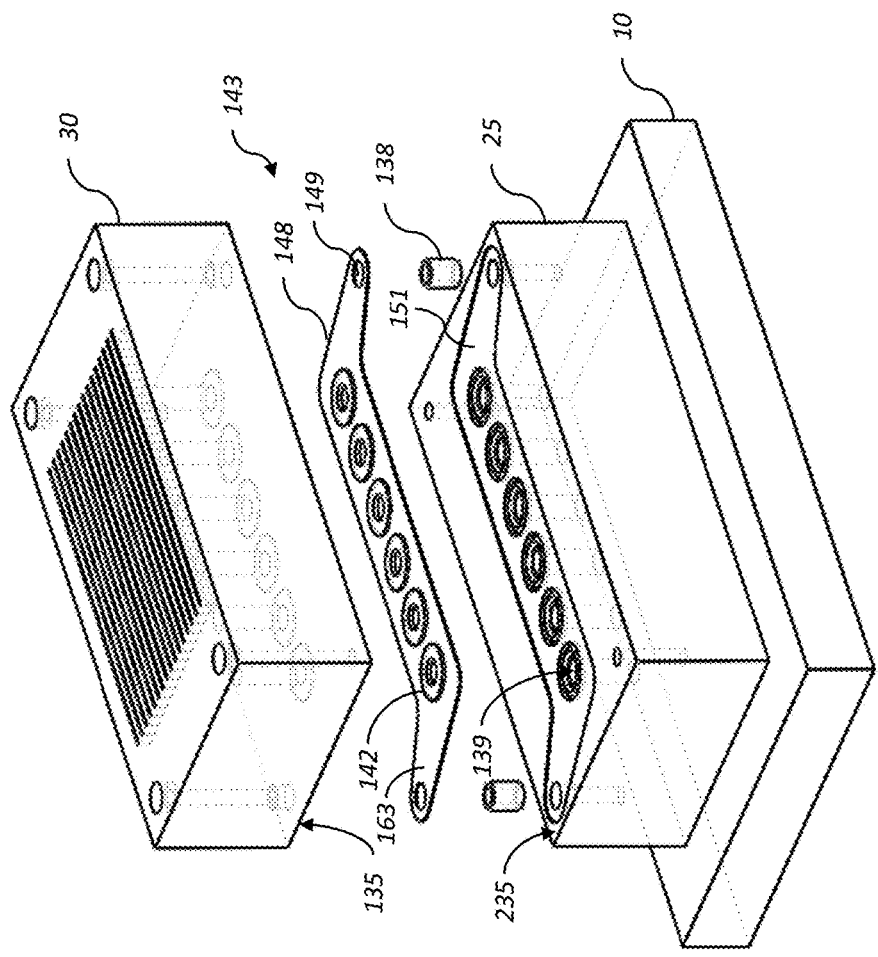
FIG. 13 is an expanded view of a manifold and deposition head illustrating the use of a sealing gasket that fits into a recess on the surface of the manifold according to another exemplary embodiment.
Figure 14:
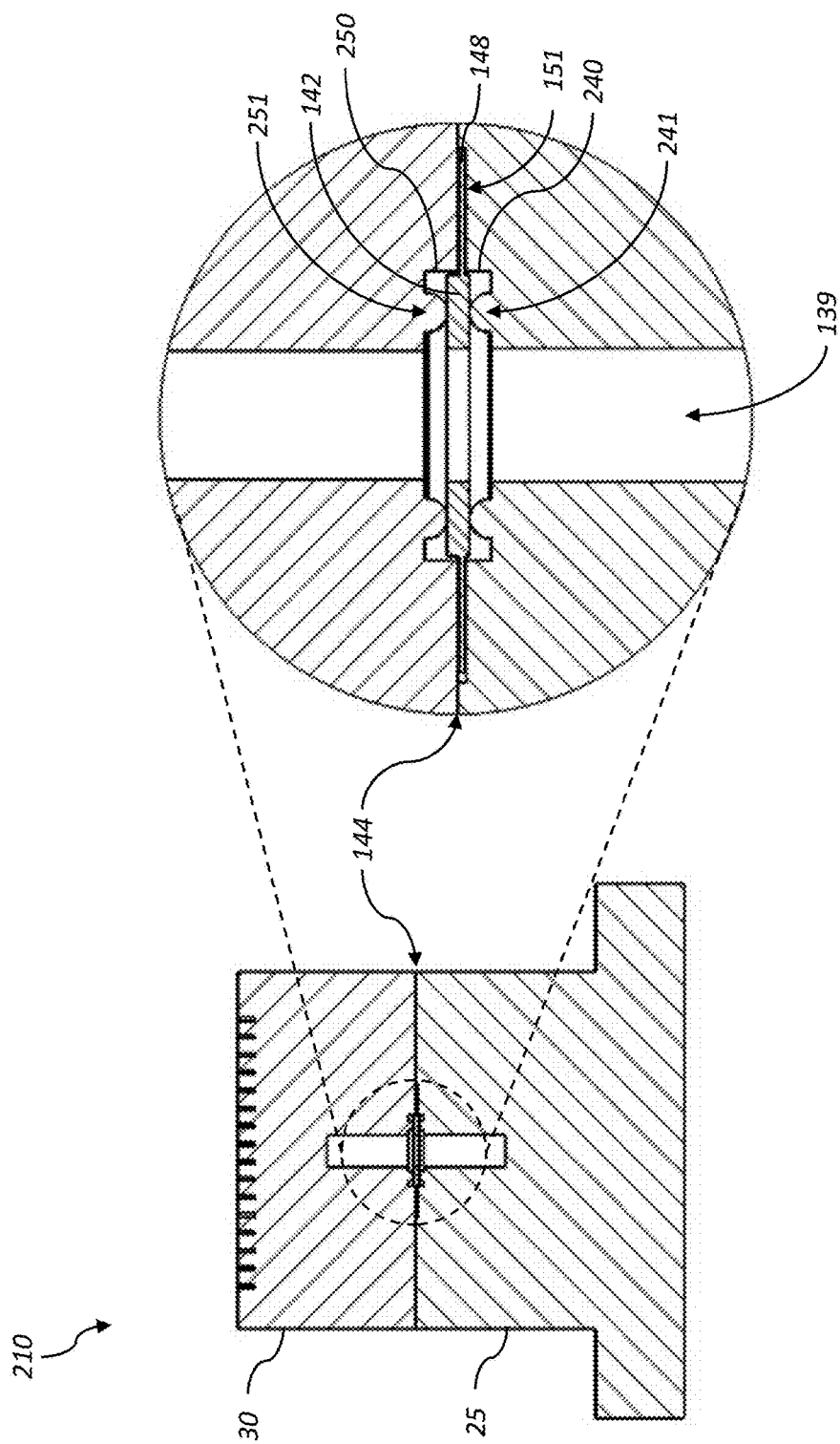
FIG. 14 is a cross-sectional view showing the gas connection and sealing region between the manifold and deposition head of FIG. 13.

In some of the illustrated configuration (e.g., see FIGS. 7 and 9), the integrated sealing component 143 introduces an additional layer of material in the stack-up tolerance including the manifold 25, the integrated sealing component 143, and the deposition head 30. In order to maintain consistent installed elevation and planar orientation of the output face 134 of the deposition head 30, the thickness of the integrated sealing component 143 would therefore need to be tightly controlled, thereby potentially increasing the cost of the sealing element 143. FIGS. 13-14, illustrate another exemplary configuration where the integrated sealing element 143 is designed to fit within a clearance pocket 151 provided in the attachment face 235 of the manifold 25. As illustrated, the integrated sealing element 143 is an integrated gasket 148 having carrier element 163 with a perimeter which includes locating pin apertures 149 corresponding to the locations of the alignment pins 138, and an array of sealing elements 142 formed around holes corresponding to the gas connection openings 139, but is smaller than the entirety of the attachment face 235 of manifold 25. In alternative arrangements, the clearance pocket 151 can be provided in the mounting face 135 of deposition head 30. The land areas in the attachment face 235 (or alternatively in the mounting face 135) outside of the perimeter of the integrated gasket device 148, and therefore outside of the clearance pocket 151, provide an adequate mating surface to deterministically set the position of the output face 134 of the deposition head 30 when the deposition head 30 and the manifold 25 are brought into line-to-line contact 144 by the retention fasteners. In these embodiments, the sealing elements 142 extend beyond the depth of the clearance pocket and are compressed to seal the gas connections as shown in FIG. 14. An advantage of using an integrated gasket 148 in a clearance pocket 151 is that no additional retention force is required to compress the integrated gasket 148 outside of the sealing elements 142 because the pocket 151 is deeper than the carrier element 163 of the integrated gasket 148 is thick. Therefore, the thickness of integrated gasket device 148 is not critical.

Figure 15:
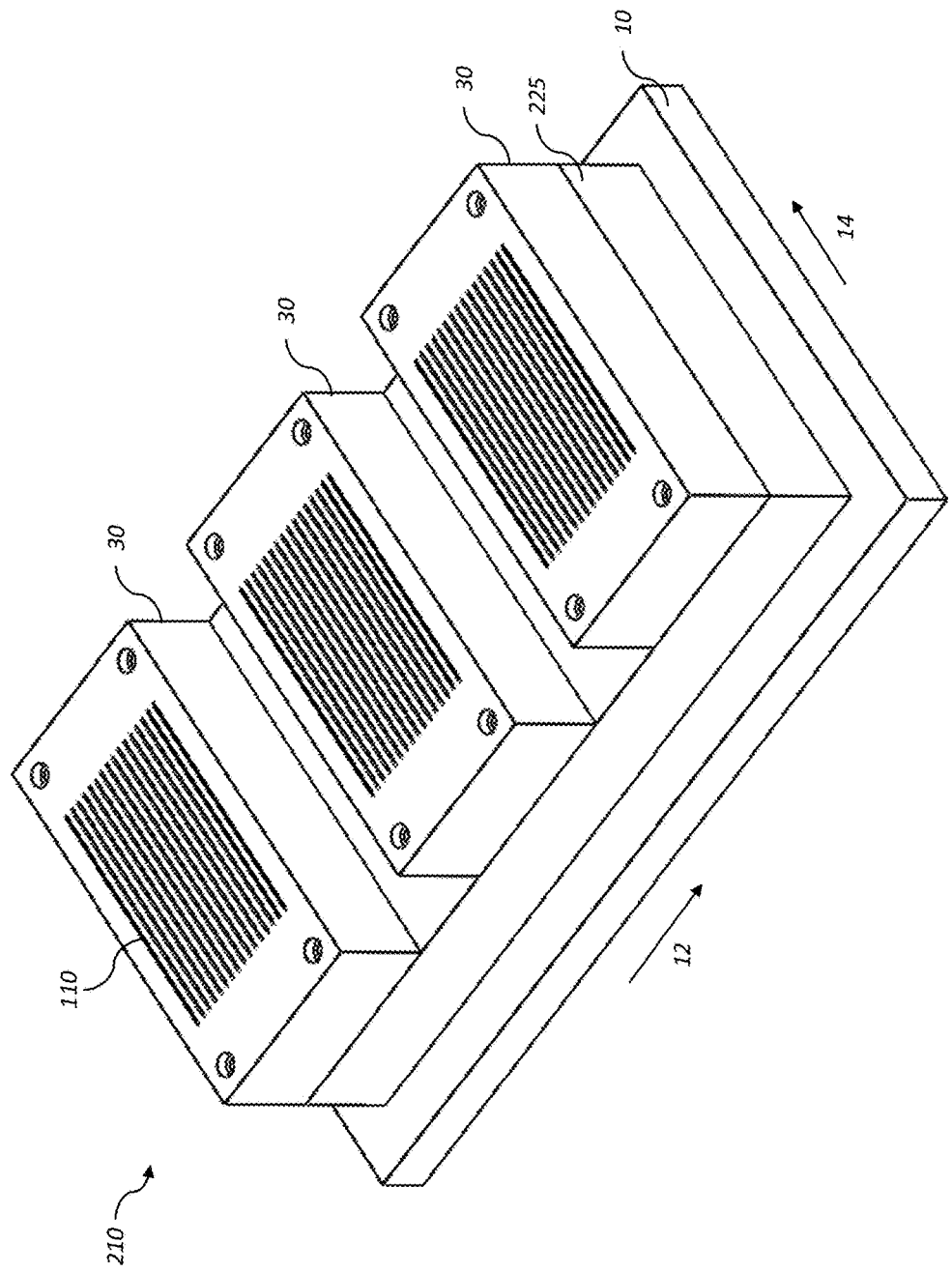
FIG. 15 illustrates an exemplary embodiment of a deposition unit having three deposition heads mounted to a common manifold.
Figure 16:
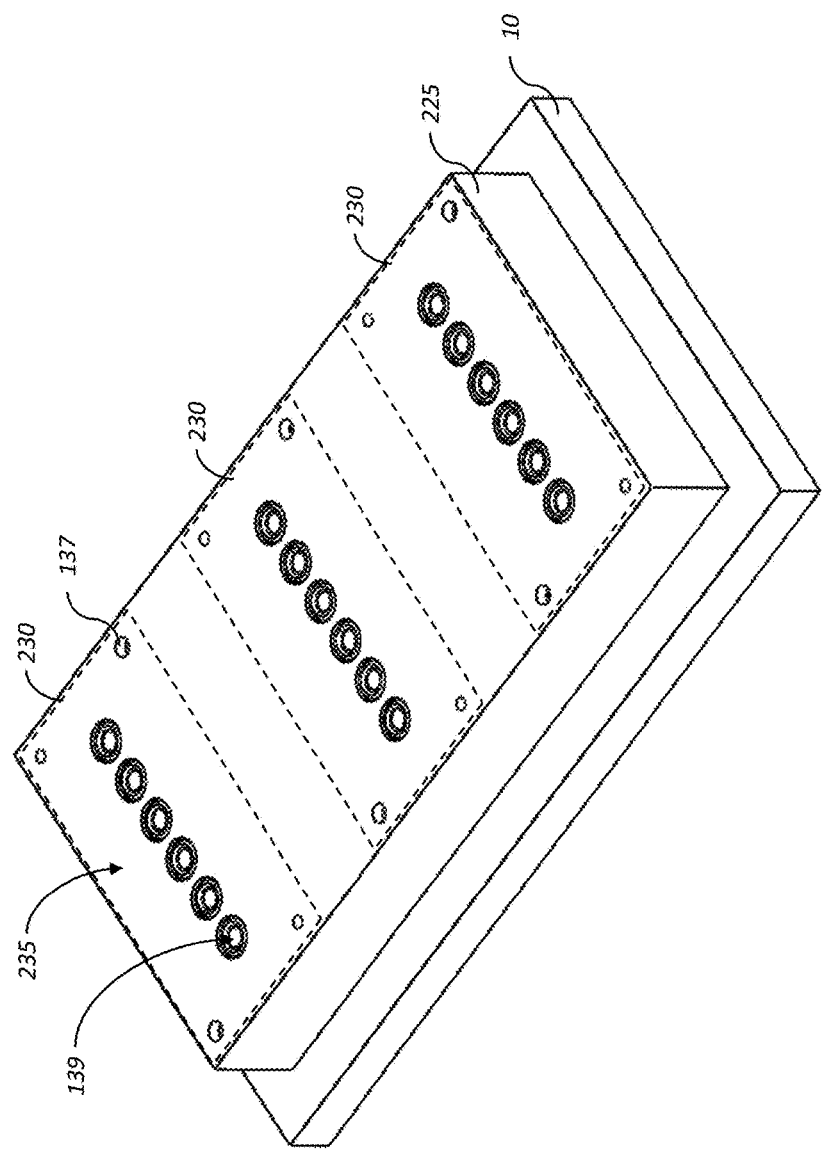
FIG. 16 illustrates additional details of the common manifold of FIG. 15.

As previously described, SALD systems only require a single deposition head 30. However, when using a single deposition head 30 the width of the coating area is limited by the width of the deposition head 30. In some embodiments of the present invention, larger and more capable systems include deposition units 210 with multiple deposition heads 30 installed on a single complex common manifold, or alternatively on multiple simple manifolds. FIGS. 15-16 illustrate a deposition unit 210 with a 1×3 array of deposition heads 30 arranged in an in-track direction 12 on a single common manifold 225. The deposition heads are mounted in corresponding interface regions 230 of the common manifold 225 which are spaced apart in the in-track direction 12. The deposition heads 30 have gas openings (i.e., gas slots 110) that extend in a cross-track direction 14.

The illustrated system can be operated using a single set of process gases to grow a single material with up to a net 3× increase in the material deposition rate relative to a system having a single deposition head 30 of the same design. In this case, a single gas connection can be provided on the common manifold 225 for each of the process gases, and gas passages within the common manifold 225 can be used to connect each gas connection to corresponding gas connection openings 139 for each of the deposition heads 30. In alternative embodiments, the deposition heads 30 can be supplied with different process gases through the common manifold 225, and the system can then be used to deposit a multilayer film stack, or "laminate" structure, in-line. Although three deposition heads 30 are illustrated, other numbers of deposition heads 30 may be used in alternative embodiments, provided that the manifold 225 is suitably plumbed, to deposit unique materials at unique conditions to create highly complex layered coatings.

FIG. 16 illustrates additional features of the common manifold 225 used in FIG. 15. As shown there are alignment features (e.g., counterbores 137) and gas connection openings 139 in the interface regions 230 for each of the three deposition heads 30. Any of the previously described sealing elements 142 or integrated sealing elements 143 can be used to seal the gas connections between the deposition heads 30 and the common manifold 225. In preferred arrangements, each deposition head 30 will have its own set of sealing elements 142 or integrated sealing element 143 such that maintenance on each deposition head 30 can be performed independently.

In a modular system, individual heads can be added or removed by the use of blanking plates (not shown) in the corresponding location on common manifold 225 in order to customize the coating system to the application at hand. The blanking plates seal the gas connection openings 139 for any deposition head regions where deposition heads 30 are not attached. The blanking plates preferably include sealing elements corresponding to the gas connection openings 139 that seal the desired deposition head region. Blanking plates may be of any thickness up to and including the thickness of a deposition head 30. Preferred configurations utilize blanking plates having a thickness less than that of deposition head as to not interfere with the coating area. In some embodiments, the blanking plates may be composed of two parts: a blanking gasket and a blanking head, where the blanking head is attached to the common manifold 225 and compresses the blanking gasket to seal the gas connection openings 139. In other configurations, the blanking gasket can be designed to selectively seal the supply of reactive gases and used with the common deposition head 30 to supply inert gas in the inert zone and purge zones. Similarly, the optional vacuum exhaust may be "blanked" or provided to the head in order to supply a preload force to the substrate.

Figure 17:
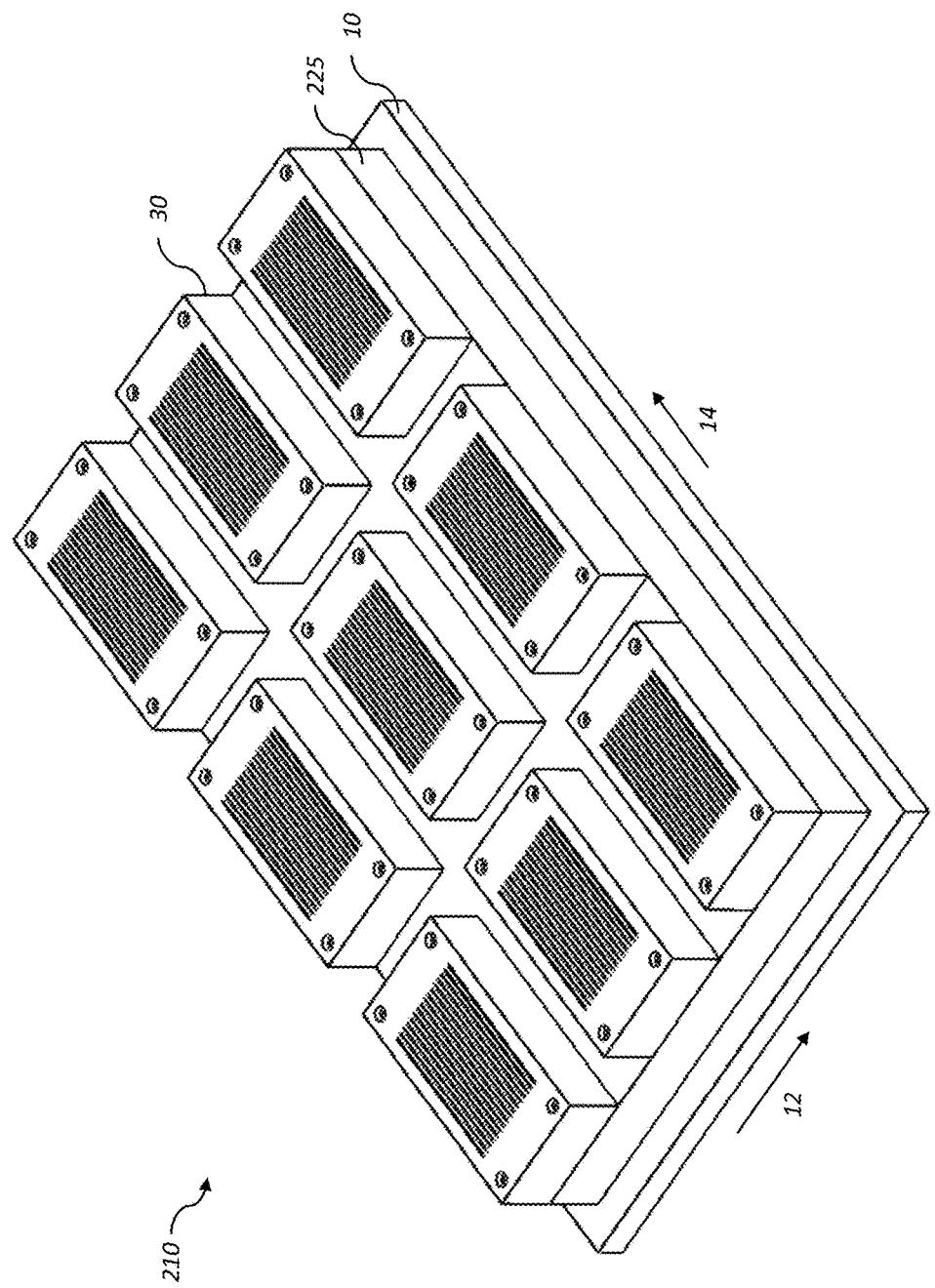
FIG. 17 illustrates another exemplary embodiment of a deposition unit having an array of nine deposition heads mounted to a common manifold.

In the arrangement of FIG. 15, three deposition heads 30 are arrayed in the in-track direction 12. It will be obvious to one skilled in the art that a wide variety of different numbers and configurations of multiple deposition heads 30 on a common manifold 225 can be used in accordance with the invention. For example, in alternative arrangements, the deposition heads 30 can be arrayed in the cross-track direction 14, or in both the in-track direction 12 and the cross-track direction 14. FIG. 17 illustrates an exemplary configuration where a 3×3 array of identical deposition heads 30 are mounted on a common manifold 225. In addition to the advantages described above, this arrangement can be used to provide a wider coating area. The deposition unit 210 illustrated in FIG. 17 has not been designed to provide a seamless coating, and as shown would be useful for applications where individual stripes or different isolated regions are to be deposited at different cross-track positions. For example, such an embodiment would be useful in applications, such as depositing active electronic materials where it is only necessary to provide coatings along certain locations, such as the edges of a device.

Figure 18:
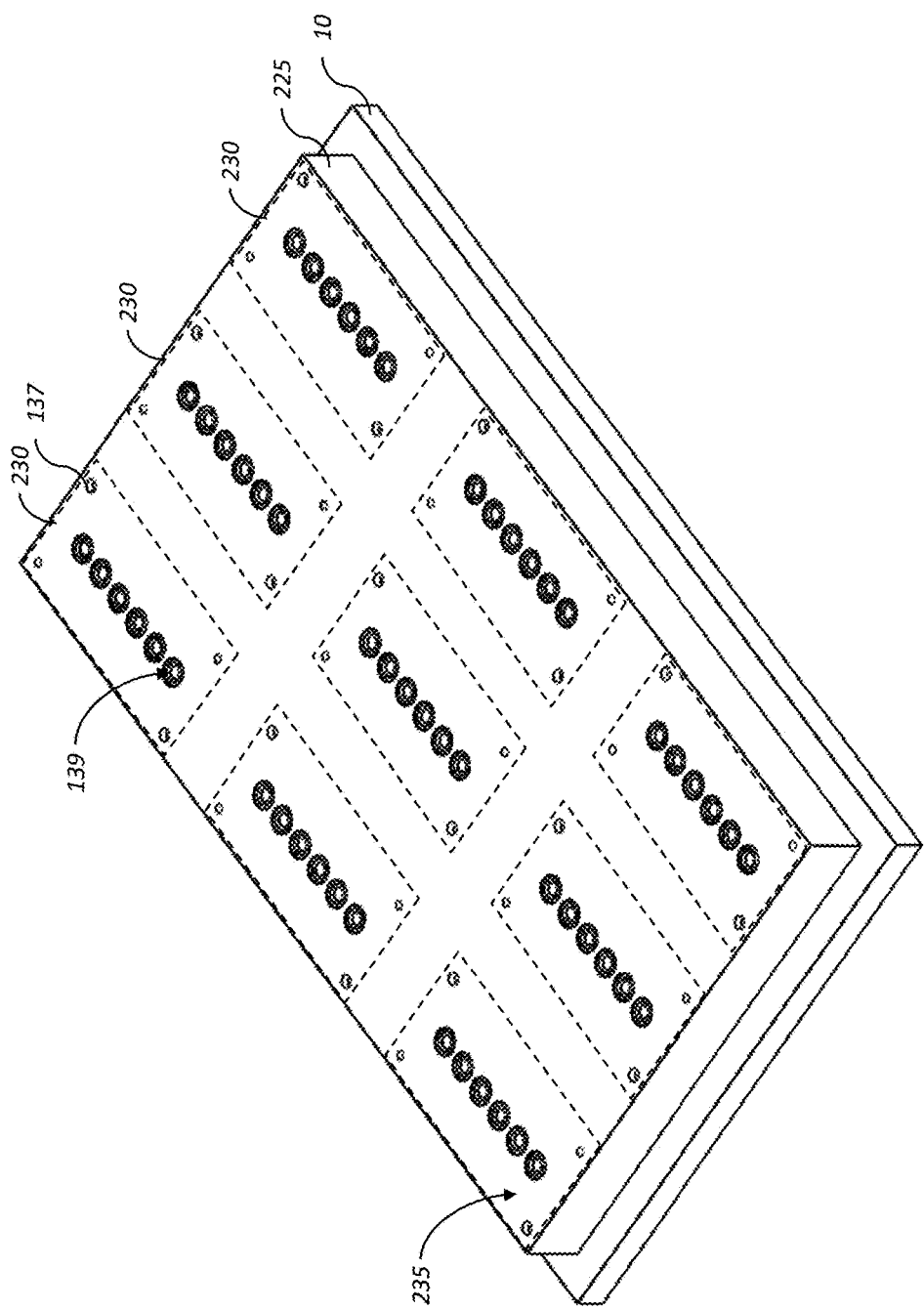
FIG. 18 illustrates additional details of the common manifold of FIG. 17.

FIG. 18 highlights the connections at the attachment face 235 of the common manifold 225. As shown there are alignment features (e.g., counterbores 137) and gas connection openings 139 in the interface regions 230 for each of the nine deposition heads 30 of FIG. 15. Any of the previously described sealing elements 142 or integrated sealing elements 143 can be used with the deposition heads 30 and common manifold 225. In preferred arrangements, each deposition head will have its own set of sealing elements 142 or integrated sealing element 143 such that maintenance on each head 30 can be performed independently.

Figure 19:
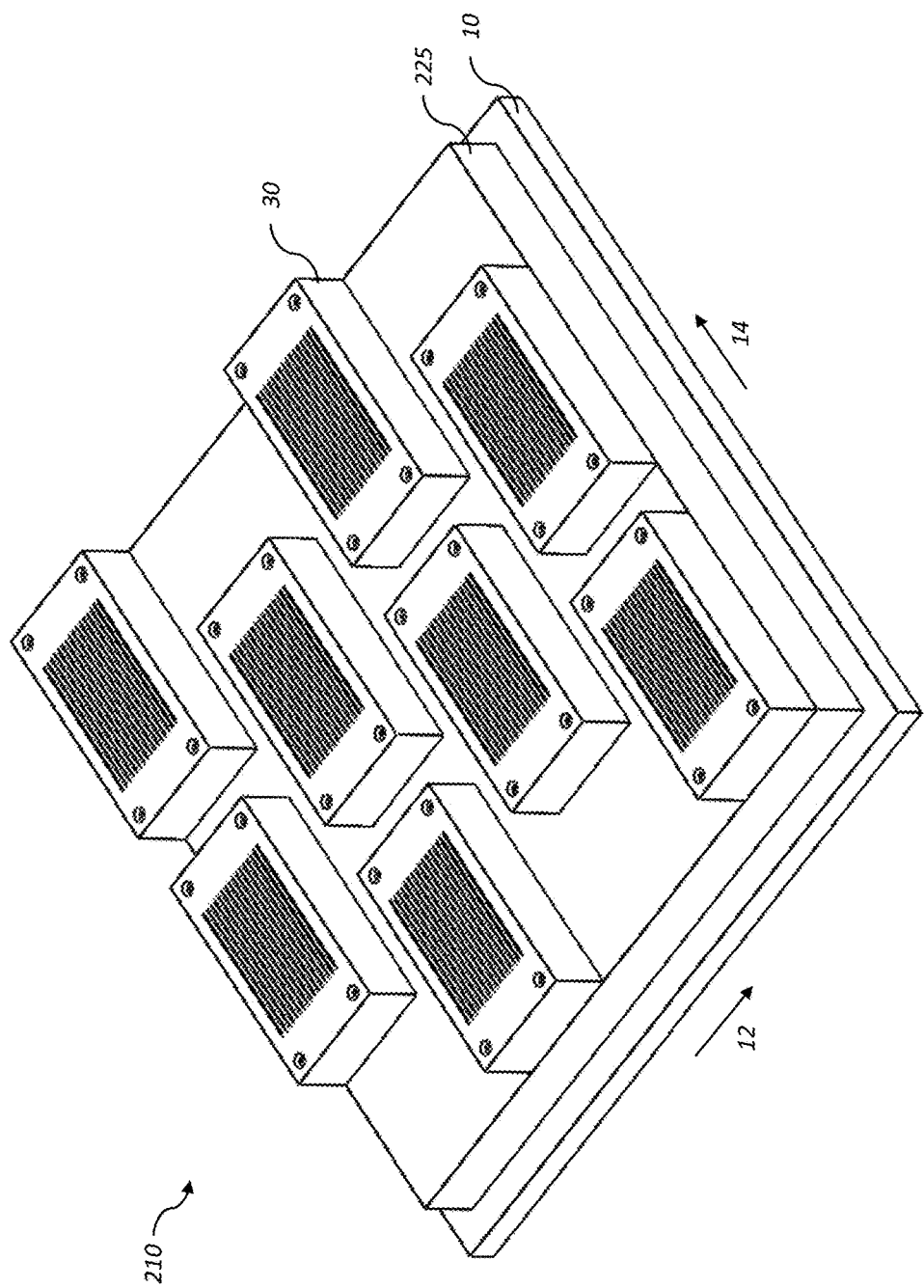
FIG. 19 illustrates another exemplary embodiment of a deposition unit having a staggered array of eight deposition heads mounted to a common manifold.

Another example is shown in FIG. 19 which illustrates a 2×4 staggered array of deposition heads 30 where each row of deposition heads 30 is displaced in the cross-track direction 14 relative to the prior row such that the coating gaps generated by the gaps between the deposition heads 30 in one row are filled by the next row of deposition heads 30. The stagger and head width can be configured to provide an intentional gap or overlap as appropriate for a given application.

Figure 20:
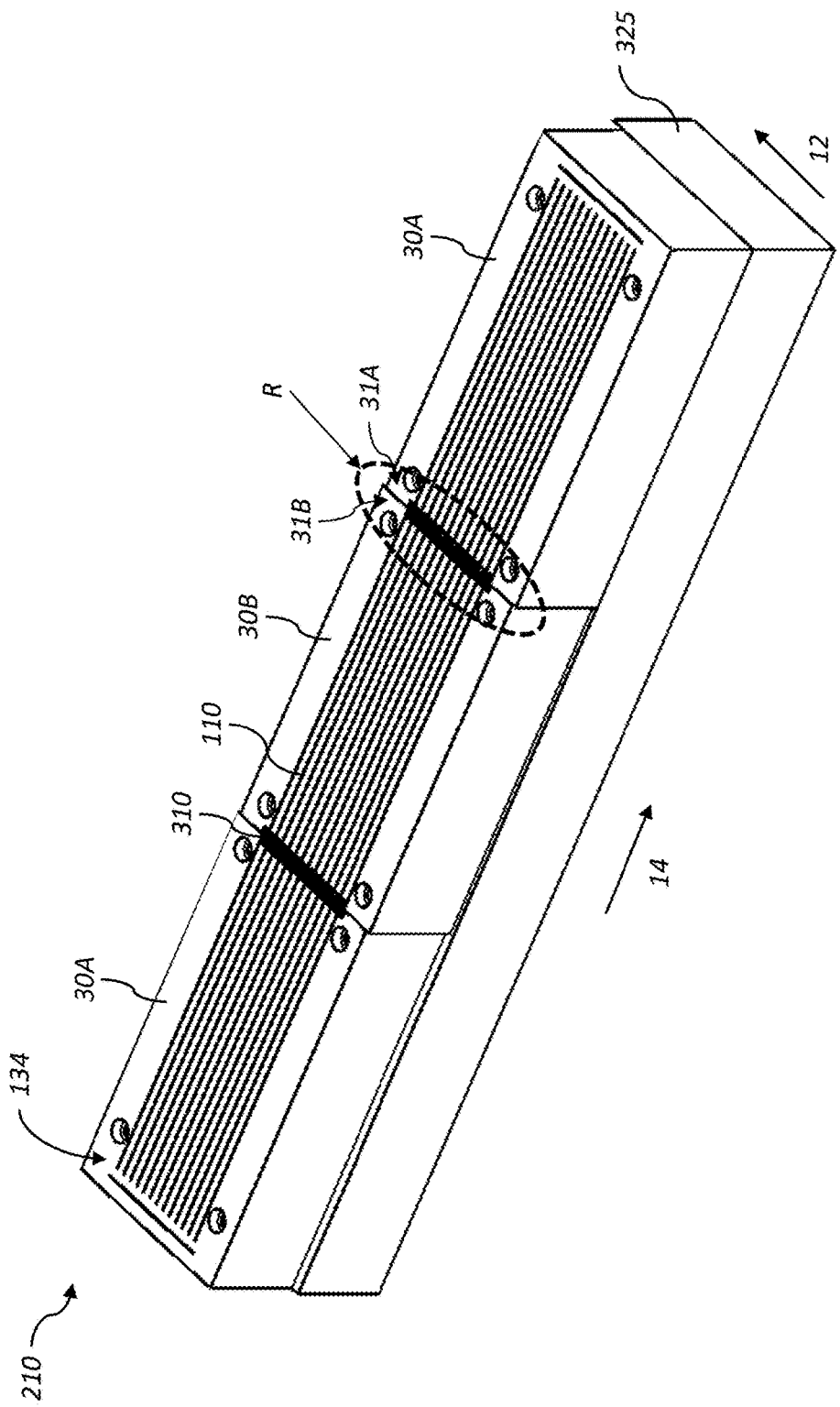
FIG. 20 illustrates an exemplary deposition unit including three interlocking deposition heads having interlocking protrusions.

Although in some of the previously described configurations, coatings from each deposition head 30 may overlap, the deposition zones are spatially confined to each deposition head 30. In some instances, it is desirable to have an SALD system 200 where multiple deposition heads are configured to provide a single deposition zone that is wider in the cross-track direction 14 than any single deposition head 30. In order to provide a single deposition zone from multiple deposition heads 30, some embodiments of the present invention provide a deposition unit 210 having a plurality of interlocking deposition heads 30A, 30B as illustrated in FIG. 20. In preferred configurations, the interlocking deposition heads 30A, 30B are mounted on a common manifold 325, and have interlocking structures 310 at the abutting ends 31A, 31B of the depositions heads 30A, 30B such that the gas slots 110 interdigitate when joined together.

This arrangement enables very wide thin-film layers having a uniform thickness to be deposited without swath boundaries. The interlocking deposition heads 30A, 30B form a single deposition zone, and can be used in the saturated ALD regime to yield a uniform coating. In the illustrated example, a single deposition zone is formed using three interlocking deposition heads 30A, 30B which is approximately 3× wider in the cross-track direction 14 than the deposition zone associated with a single deposition head 30. As shown, there is one center interlocking deposition head 30B having interlocking structures 310 on both ends, and two end interlocking deposition heads 30A having an interlocking structure 310 on one end. It should be understood that a single deposition zone can be formed by joining different numbers of interlocking deposition heads 30A, 30B. For example, a deposition zone that is approximately 2× wider than that of a single deposition head 30 can be formed by joining two of the end interlocking deposition heads 30A. Alternatively, a deposition zone that is approximately 4× wider than that of a single deposition head 30 can be formed by using two of the center interlocking deposition head 30B between two of the end interlocking deposition heads 30A.

As shown, the interlocking deposition heads 30A, 30B are mounted to a common manifold 325. In alternate embodiments, the interlocking deposition heads 30A, 30B can have individual gas fittings so that no manifold is required, or can be mounted to corresponding individual manifolds 25. In the illustrated configuration, the common manifold 325 serves to position the interlocking deposition heads 30A, 30B so that the output faces 134 of the individual interlocking deposition heads 30A, 30B, including the abutment regions, are coplanar.

The abutting ends 31A, 31B of the adjacent interlocking deposition heads 30A, 30B have interlocking structures that include an alternating sequence of protrusions and recesses. The protrusions on the abutting end 31A of one of the interlocking deposition heads 30A fit into the recesses on the corresponding abutting end 31B of the adjacent interlocking deposition head 30B. The gas slots 110 extend into the protrusions on the abutting ends 31A, 31B of the adjacent interlocking deposition heads 30A, 30B such that in an overlap region the gas slots 110 on one of the adjacent interlocking deposition heads 30A, 30B overlap with the gas slots 110 on the other of the adjacent interlocking deposition heads 30A, 30B.

Figure 21:
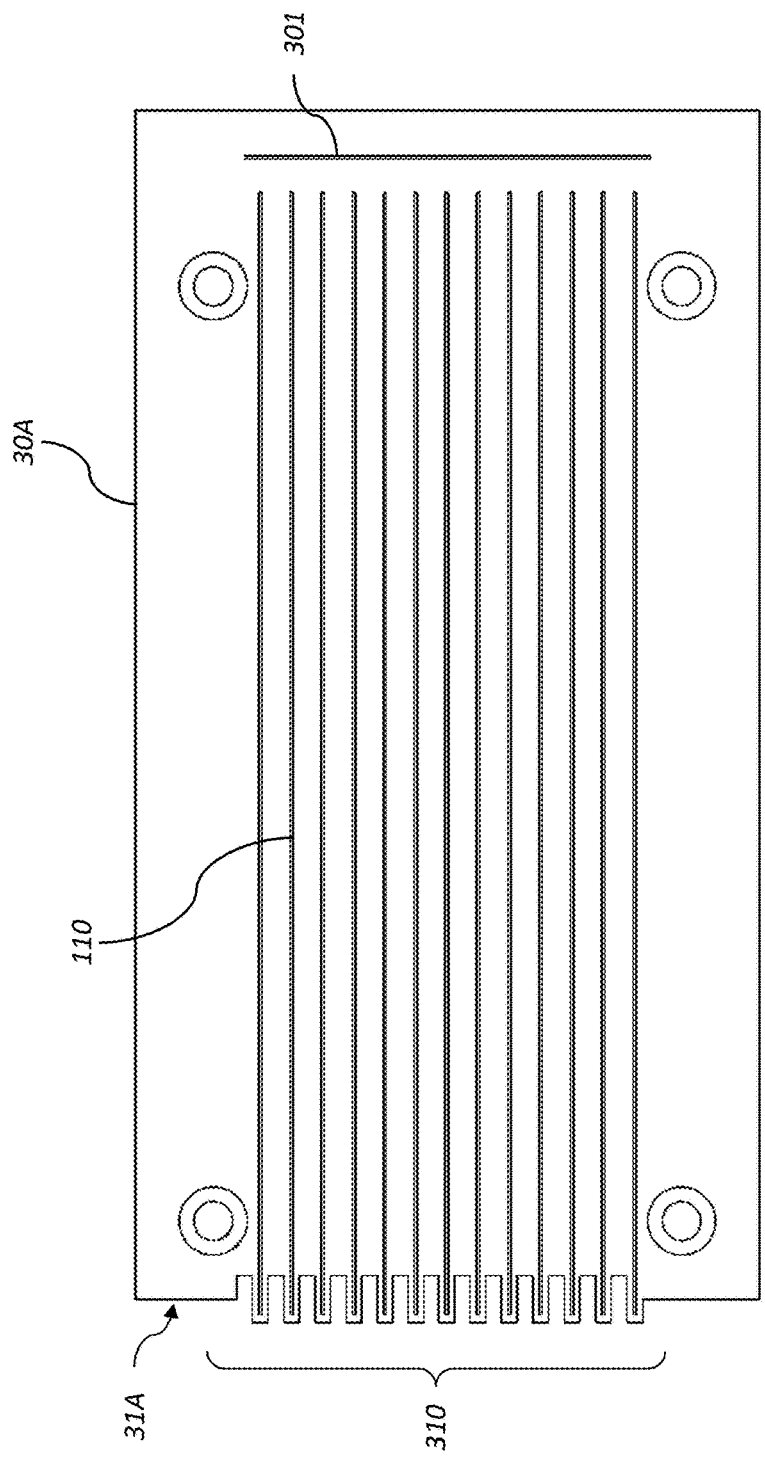
FIG. 21 illustrates additional details of the end interlocking deposition head of FIG. 20.

FIG. 21 shows a top-view of one of the interlocking deposition heads 30A used in the assembly of FIG. 20. The interlocking structure 310 is provided on only one abutting end 31A of the interlocking deposition heads 30A for use as an end head. In preferred configurations there is an end slot 301 for providing inert gas on the end of the interlocking deposition heads 30A opposite the interlocking structure 310 on the abutting end 31A. The inert end slot 301 is useful for isolating the deposition region from the external environment in the cross-track direction, for instance by maintaining anaerobic conditions at the edge. The interlocking structure 310 includes an alternating sequence of protrusions and recesses. The configuration illustrated in FIG. 21 uses protrusions and recesses having rectangular profiles, thereby providing a rectangular interlocking design.

Figure 22:
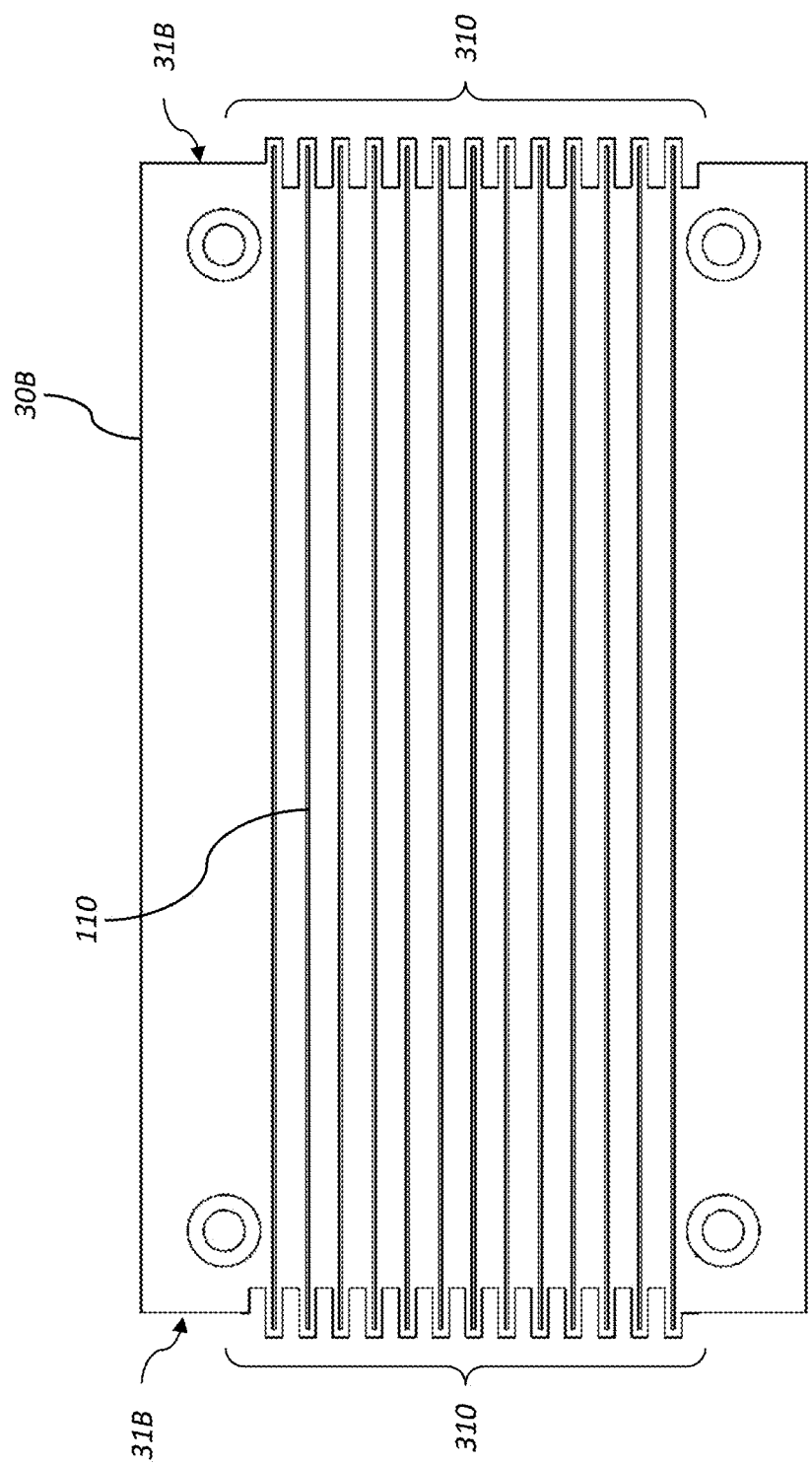
FIG. 22 illustrates additional details of the center interlocking deposition head of FIG. 20.

FIG. 22 shows a top-view of the two-sided center interlocking deposition head 30B used in the assembly of FIG. 20. The interlocking deposition head 30B has interlocking structures 310 on the two abutting ends 31B. These interlocking structures 310 enable a plurality of interlocking depositions heads 30B to be cascaded in the cross-track direction 14, where the array of center interlocking deposition heads 30B is terminated with single-sided end interlocking deposition heads 30A on either end.

Figure 23:
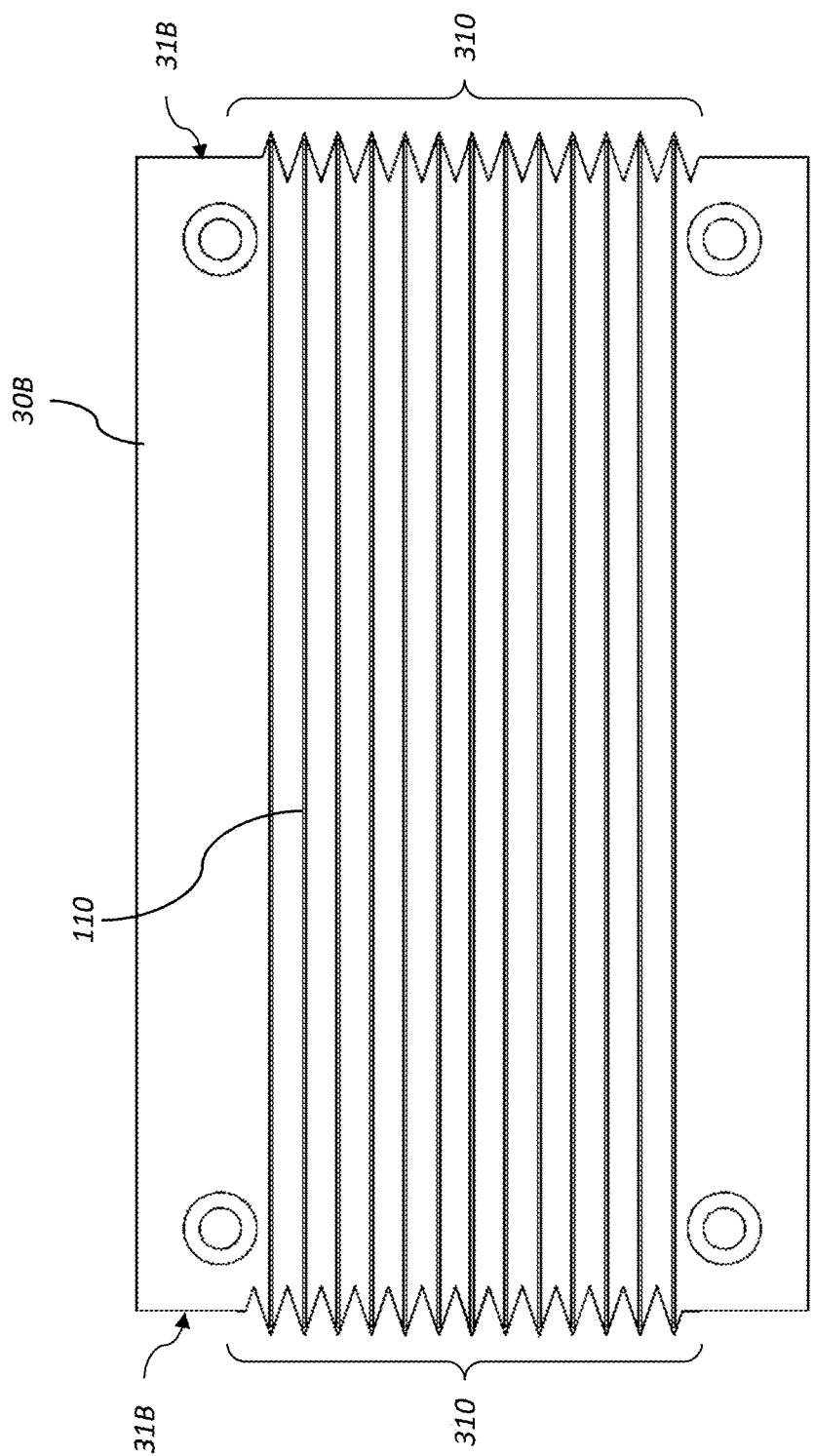
FIG. 23 illustrates an alternate configuration for an interlocking deposition head having triangular interlocking protrusions.
Figure 24:
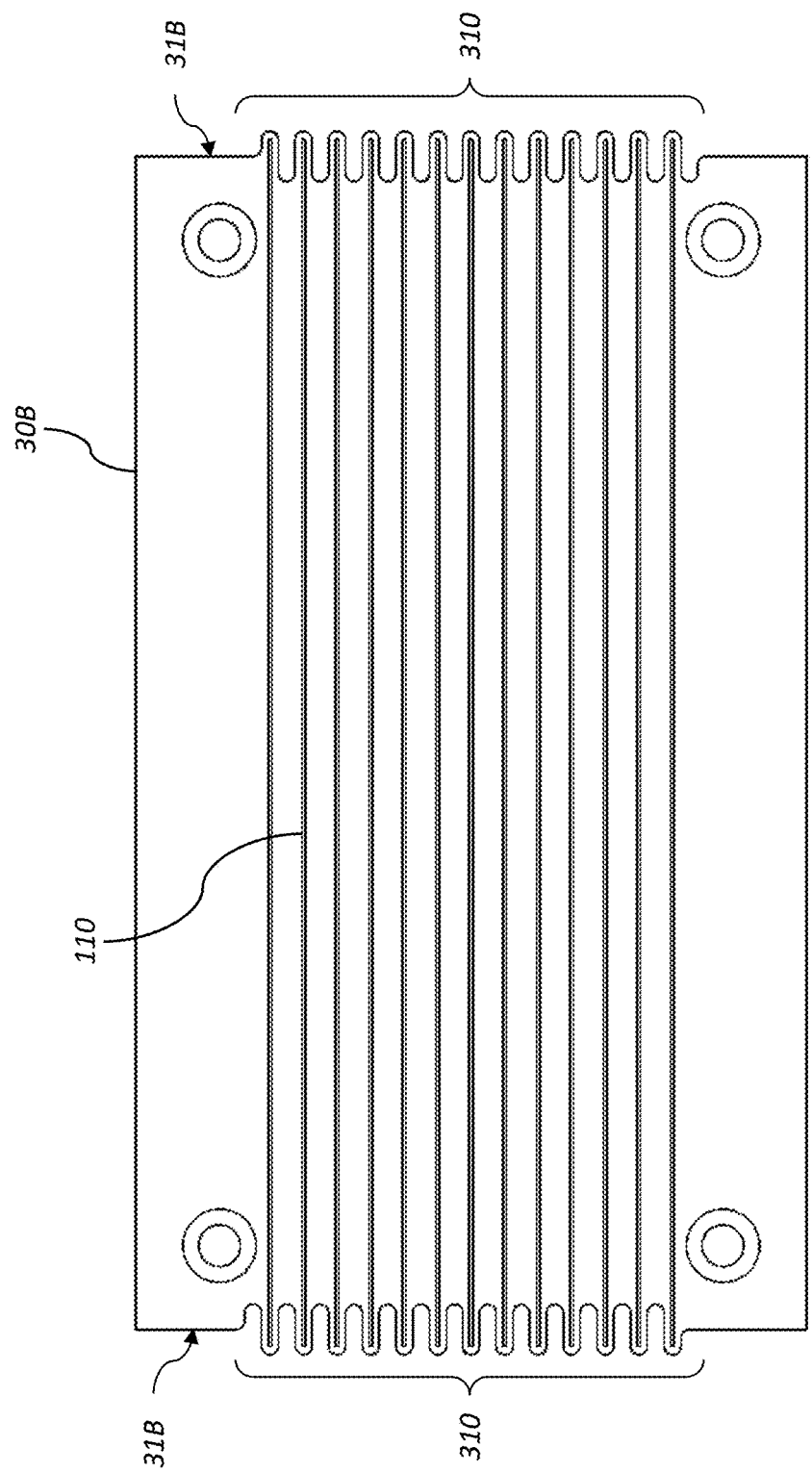
FIG. 24 illustrates an alternate configuration for an interlocking deposition head having interlocking protrusions and recesses with semi-circular ends.

FIGS. 23 and 24 illustrate alternative configurations for the interlocking structures 310 useful in the various embodiments. All interlocking structures 310 of the present invention have an alternating sequence of protrusions and recesses. The configuration of FIG. 23 uses interlocking structures 310 having triangular undulations (i.e., a sequence of protrusions and recesses having triangular ends). The configuration of FIG. 24 uses interlocking structures 310 having rounded undulations (i.e., a sequence of protrusions and recesses having rounded ends). In the illustrated example, the rounded ends are semi-circles, although they could alternatively be other rounded shapes such as elliptical or parabolic shapes. The rounded ends of the protrusions and recesses are designed to interlock with the interlocking structures 310 on adjacent interlocking deposition heads 30A, 30B. Other shape profiles (e.g., trapezoidal shapes) can also be used for the protrusions and recesses of the interlocking structures 310 and should be considered to be within the scope of the present invention.

The interlocking structures 310 can be machined by metal removal operations, such as milling, from a larger block of parent material. Given the orientation of the features on the interlocking deposition heads 30A, 20B, end milling can be used for the rectangular features. Rectangular, trapezoidal, and triangular features can be machined using individual or ganged side milling cutters known to one skilled in the machine trades. In some cases, standard cutters, such as spline form cutters can also be employed. Interlocking structures 310 having rectangular contours (e.g., see FIG. 22) and triangular contours (e.g., see FIG. 23) which have sharp corners are generally less desirable from a manufacturing standpoint relative to those having rounded corners (e.g., see FIG. 24). The presence of sharp inside corners within the rectangular and triangular contours presents a difficulty for milling cutters, where inevitable wear dulls the tool corners slightly. If such contours are used, minor chamfers or rounds (not shown) are typically necessary on the mating positive features to account for this and provide assembly clearance.

Figure 25:
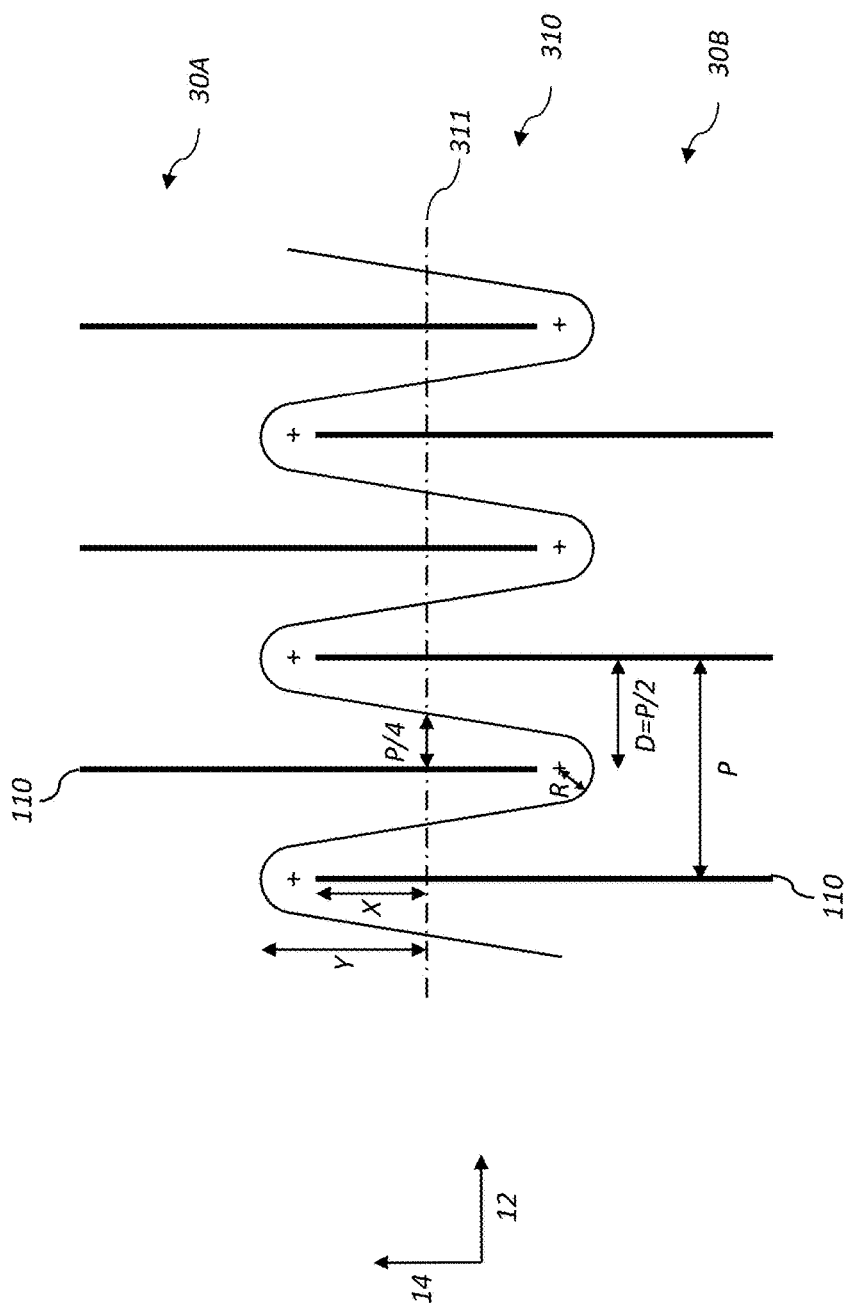
FIG. 25 illustrates an alternate configuration for an interlocking deposition head having interlocking protrusions and recesses with rounded ends and sloped faces.

In some machining and finishing operations, it may be advantaged to modify the side faces of the protrusions in the contour of FIG. 24 such that they form an acute angle rather than being parallel. (The acute angle converges toward the ends of the protrusions so that the profile is not reentrant.) FIG. 25 shows an exemplary contour of this type. The salient dimensions have been parameterized in terms of the slot pitch P between the gas slots 110 of the interlocking deposition heads 30A, 30B. In this example, a symmetric arrangement of the interdigitated features is used. The offset in the in-track direction 12 between adjacent slots carrying the same gas in the interlocking deposition heads 30A, 30B are separated by a distance of D (from slot center to slot center). In the illustrated example D=P/2 so that the gas slots 110 in one of the interlocking deposition heads 30A is halfway between the gas slots 110 in the other interlocking deposition head 30B. This enables the tightest packing between gas slots 110. With respect to the centerline 311 of the symmetric joint, the cross-track distance that the protrusions extend into the adjacent deposition head 30 is given by Y, and the cross-track distance that the gas slots extend into the protrusion is given by X. In preferred arrangements 0<X<2D, and more preferably D/2<X<2D. (In the exemplary configuration of FIG. 25, X=D.) To ensure adequate material at the end of the gas slots 110, it is generally desirably that Y≥X+D/2, thus providing at least D/2 of land distance. For the case where X≥D, the radius R of the fillet and rounds R is preferably in the range 0.2·D≤R≤0.5·D, and more preferably 0.3·D≤R≤0.40·D. The flanks of the grooves are preferably tangent to the fillets and rounds. To maintain adequate land area, the width of the gas slot is preferably no more than D/3, and more preferably is nor more than D/4.

An advantage of the rounded end and valley features shown in FIG. 25 is that there are no sharp inside corners. This enables the dressing of a form grinding wheel to suitable contour, wherein the interdigitated features may be finished to high precision, for example, by creep feed grinding. The rounded interdigitated features are also amenable to fabrication by wire electric-discharge machining (WEDM). With the dimensional relationships described above, the minimum fillet is slightly larger than general use EDM wire (0.008"-0.010" diameter), thus enabling the contour to be rough cut and skimmed. The largest radius is small enough that the interdigitated features are non-re-entrant to enable alternative processes (e.g., grinding), matched finishing of mating blocks, and easy installation (i.e., the interlocking structures 310 can slide into each other without lifting one out of plane).

Figure 26:
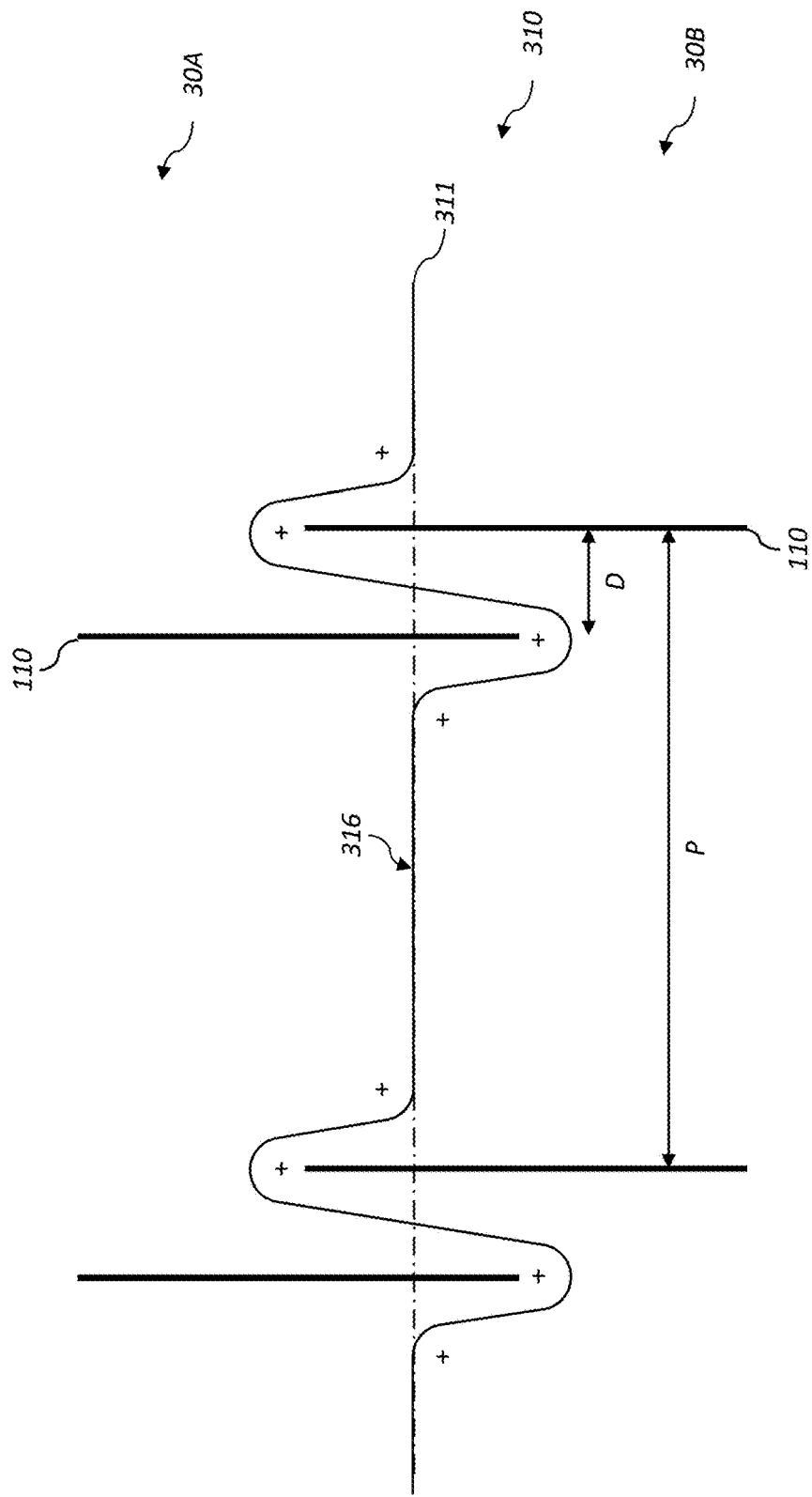
FIG. 26 illustrates an alternate configuration for an interlocking deposition head having interlocking protrusions and recesses with rounded ends and sloped faces with intervening flat regions.

Another exemplary shape for the interlocking structures 310 is illustrated in FIG. 26. In this case, the gas slots 110 in one of interlocking deposition heads 30A are offset from the center of the slot pitch P in the adjacent interlocking deposition heads 30B such that the distance D between the gas slots 110 having the same gas flows is smaller (i.e., D<P/2). Another way to say this is that the recesses in the interlocking structure 310 are not centered between the neighboring protrusions. In the illustrated configuration, flat regions 316 are provided between each recess/protrusion pair, although in other configurations different profiles can be used. Preferably, rounded corners are used to blend the recesses and protrusions to the flat regions 316.

Figure 27:
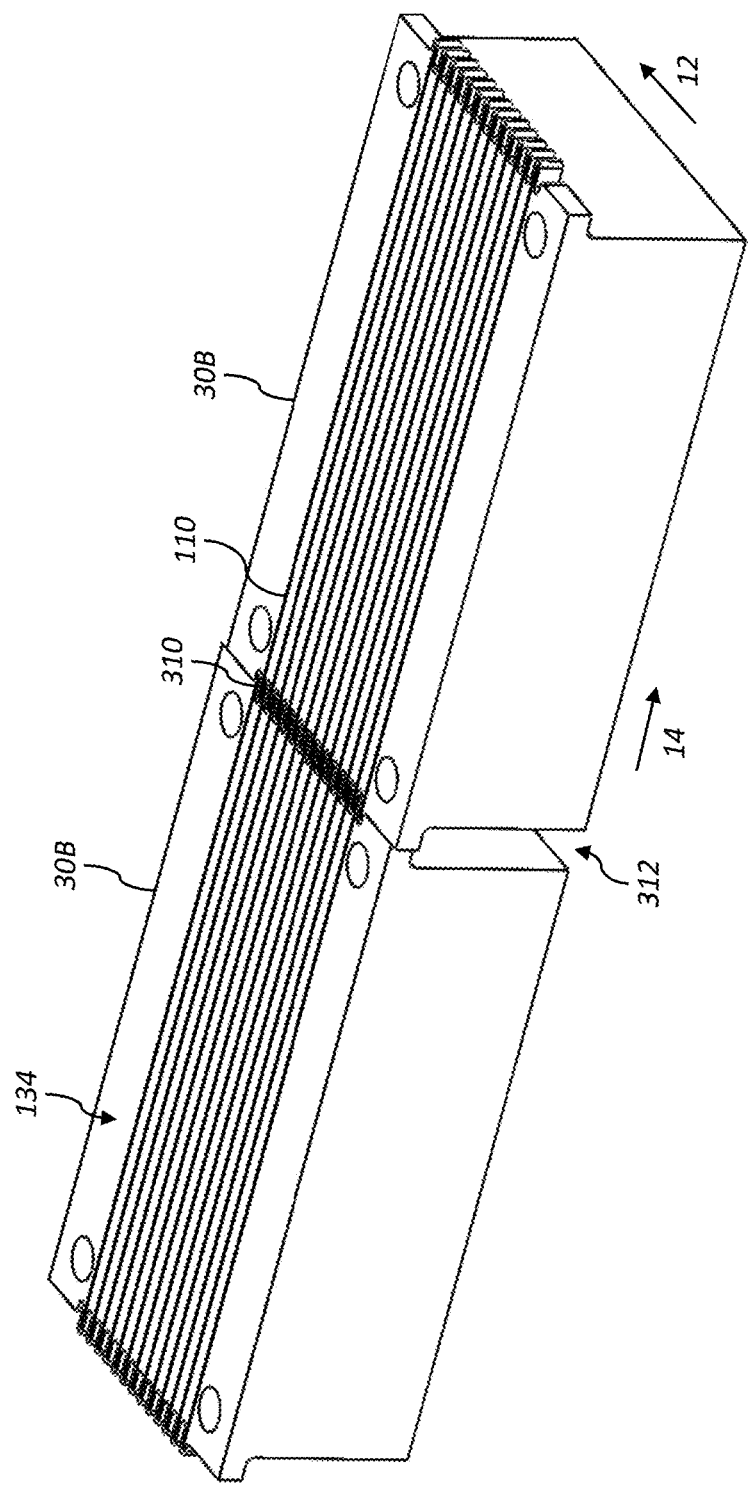
FIG. 27 illustrates an exemplary arrangement where the ends of the interlocking deposition heads are undercut.

To facilitate fabrication of the critical mating surface, with a minimum of distortion and tool wear, the ends of the interlocking deposition heads 30B may be undercut as shown in FIG. 27. In this way, the thickness (in the direction normal to the output face 134) of the interlocking structure 310 is less than the height of the deposition heads 30A, 30B. The shape of the undercut is a non-critical feature and can be anything that is conveniently machined. The resulting space 312 may be advantageously ported to an inert gas source or a vacuum source.

In some applications, intimate line to line contact of mating heads may be more important than head interchangeability with different locations in an array of heads. In this case, it is possible to machine mating faces of adjacent heads as matched pairs with their pre-designated neighbors. In this process, the mating contours of the individual heads are separately machined with a slight excess of material (i.e., "finishing stock"). Neighboring pairs are then placed in special fixtures for a final material removal process. The fixture allows the engagement of the mating features and provides for movement of one (or both) parts in the engagement direction as material is removed from one or both parts until the parts have obtained the correct final relative alignment. One example of such a fixture is well suited for material removal by electric-discharge machining (EDM) using a "die sinking" EDM machine (also referred to as a "sinker" or "ram" EDM). One interlocking deposition head 30A is placed in rigid fixture half mounted to the EDM machine platen with its position referenced to its regular installation (i.e., final use) features or datums. The second interlocking deposition head 30B, referenced by its regular installation features, is mounted to the second fixture half which is attached to the EDM machine ram. The orientation of the parts is such that the motion direction of the ram causes engagement of the mating features of the interlocking deposition heads 30A, 30B while the output faces 134 of the interlocking deposition heads 30A, 30B remain co-planar. The EDM machine spark generator is activated and erosion of the mating faces occurs while the part attached to the ram is advanced until the final relative head distance is achieved. In this processing, one interlocking deposition head 30A acts as a form tool with respect to the other interlocking deposition head 30B. The balance of material removal from the two interlocking deposition heads 30A, 30B can be influenced by the electrical polarity of the work pieces and the spark duration and energy, and additional minor motions (known as "orbiting") along the groove direction can increase straightness of the mating faces, as known to a practitioner in the die making industry.

An alternative material removal process is lapping. In this process, the parts are fixtured in positions as described above and one part is driven with an oscillatory motion in a direction parallel to the mating feature grooves while the other part moves in the direction to increase feature engagement. Abrasive slurry is applied between the parts to facilitate material removal and lapping continues until the parts achieve the final relative head distance. In this process also, one interlocking deposition head 30A acts as a form tool with respect to the other interlocking deposition head 30B.

When one pair of mating faces is completed, the workpiece from the first fixture half is removed (completed), the workpiece from the second fixture half is installed in the first position, and the next neighbor work piece is installed in the second position. The process of matching pairs is then continued until the complete row of heads has been finished.

In some applications where gas tight mating of the interlocking deposition heads 30A, 30B is required and extreme precision machining is not available or desired, a "grouting" process may be employed to seal the interdigitated features. It is necessary to prevent sealant from curing in the gas slots in the output face. Low viscosity sealant may be wicked into the joint by capillary forces, preferably from the undercut side, or through special features (e.g., V-grooves or drilled holes) created for the purpose of conveying the sealant to the joint area. Sealant may be selectively cured, or selectively prevented from curing, by flowing appropriate gas through or around the gas slots and joint area. For example, $CO_2$ may be used to cure sodium silicate based materials.

As illustrated in FIGS. 21-26, the gas slots 110 in the interlocking deposition heads 30A, 30B extend into the protrusions of the interlocking structures 310, regardless of the designed profile. This extension into the protrusions ensures that when adjacent interlocking deposition heads 30A, 30B are interlocked via the interlocking structures 310 there is overlap in the cross-track direction between the gas slots 110 of the adjacent interlocking deposition heads 30A, 30B in overlap region 317. By "overlap in the cross-track direction" it is meant that the gas slots 110 span a range of cross-track positions that overlap with each other (i.e., in the overlap region 317). In the illustrated examples, a single gas slots 110 is centered within each protrusion, although this is not a requirement. In other embodiments (not shown) the gas slots 110 can be off-center within the protrusions, or more than one gas slot 110 can extend into some or all of the protrusions. In some embodiments, not all of the protrusions have corresponding gas slots 110.

Figure 28:
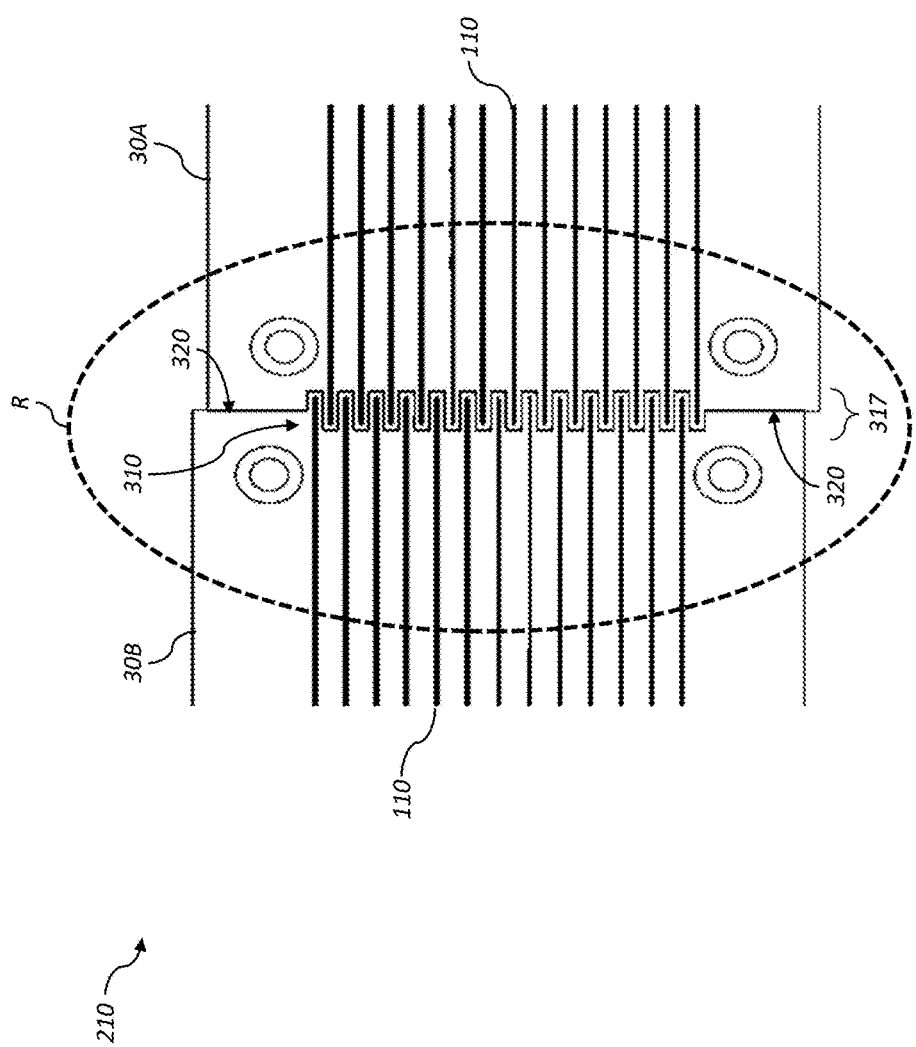
FIG. 28 is a close-up plan view showing additional details of the interface region for the interlocking deposition heads of FIG. 20.

Preferably, there should be no significant holes or gaps between adjacent interlocking deposition heads 30A, 30B when their corresponding interlocking structures 310 are interlocked. This close mating prevents trapped gases at the interface that could act as a transport site and potentially cause undesired intermixing and particulate condensation. FIG. 28 shows a top-view close-up of two interlocking deposition heads 30A, 30B in region R of FIG. 20. As illustrated, the protrusions and recesses of the corresponding interlocking structures 310 are interdigitated and closely mated. The abutting ends also include features that are aperiodic with respect to the interlocking structures 310 (in the illustrated example, the end regions 320 with no protrusions and recesses). As a result, the features on the abutting ends (in the illustrated example, the interlocking structures 310 and the end regions 320) serve as alignment features that define a unique interlocking position for the abutting ends of the two adjacent deposition heads 30A, 30B so that they can only fit together in one position. In other configurations, other types of alignment features can also be used to define the unique interlocking position. In the illustrated exemplary configuration, the end regions 320 correspond to inert zones along the leading and trailing edges of the deposition heads 30A, 30B. As previously discussed, the use of a common manifold 325, as illustrated in FIG. 20, assists in maintaining this alignment during operation. The fastening elements that fasten the deposition heads 30A, 30B to the common manifold 325 are preferably located within the inert zones.

Figure 29:
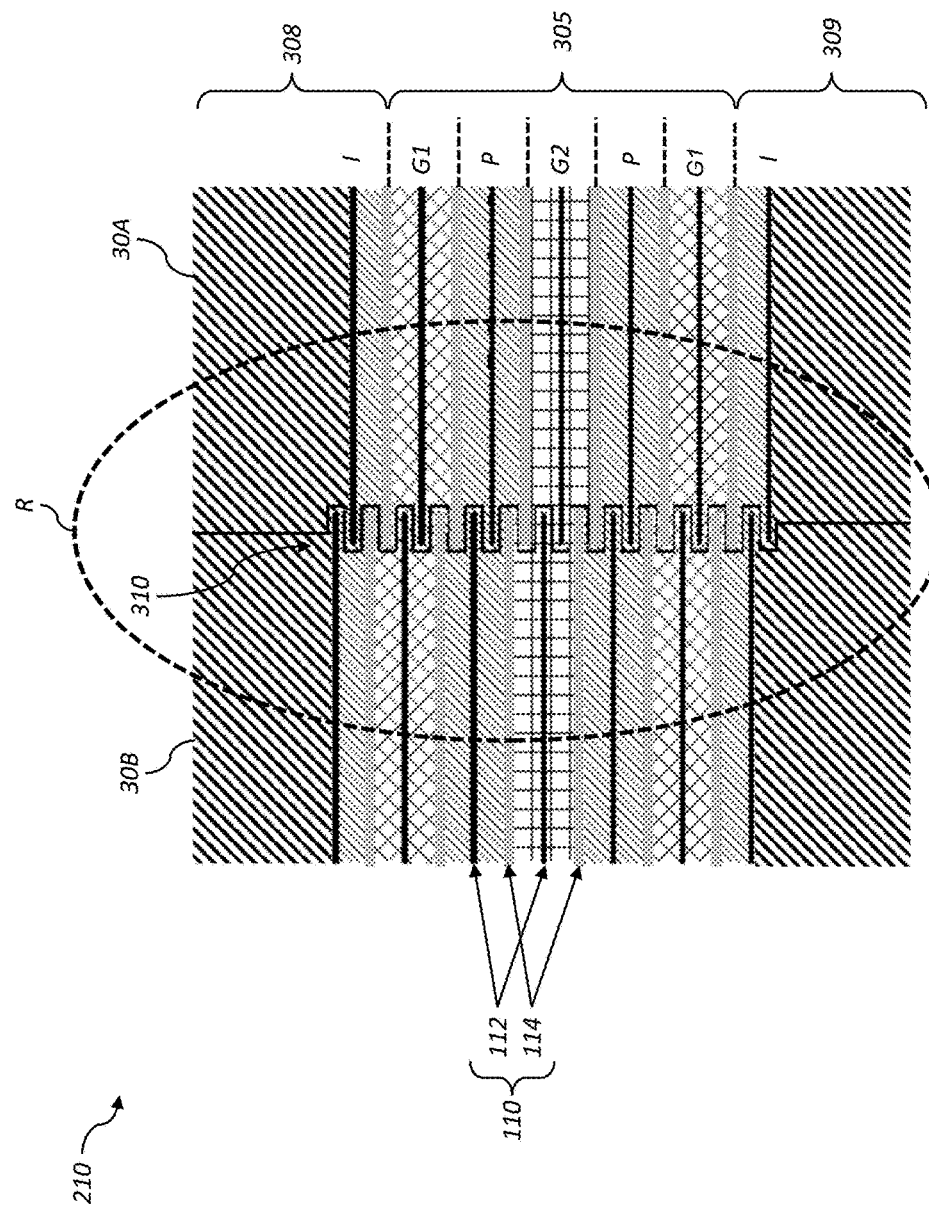
FIG. 29 illustrates the use of the interlocking deposition heads of FIG. 22 for SALD showing shaded gas regions.

FIG. 29 illustrates the same region R that was shown in FIG. 28, where the gas slots 110 are configured with the gas configuration previously shown in FIGS. 3A-3B. The exemplary interlocking deposition heads 30A, 30B shown in FIG. 29 include both output slots 112 (shown as black lines) and exhaust slots 114 (shown as gray lines), in an alternating arrangement. The interlocked deposition unit 210 will provide the same SALD cycle configuration as each of the individual deposition heads 30A, 30B. As was previously discussed, this gas configuration provides a deposition zone 305, in between inert zones 308, 309. The interlocked deposition unit 210 has the same regions within the deposition zone 305 that were discussed with respect to FIGS. 3A-3B. In particular, the deposition zone 305 includes a sequence of regions where the substrate 97 will be exposed to the first precursor gas G1, the inert purge gas P, the second precursor gas G2, the inert purge gas P, and again to the first precursor gas G1. The interlocking deposition heads 30A, 30B form a wider deposition zone 305 (in the cross-track direction 14) than is possible with a single small deposition head 30 (FIG. 4). The interlocked deposition unit 210 will provide slightly more gaseous material in the region of the interdigitated features of the interlocking structure 310, but in a self-limiting reaction this is not significant. As previously described the 1.5 cycle arrangement provides the proper sequence of gas exposure in the forward and reverse directions.

In some configurations, the exhaust slots 114 are all connected to the same gas connection and the same vacuum system. However, this can be disadvantageous because the exhaust gases that contain the first precursor gas G1 would mix with the exhaust gases that contain the second precursor gas G2, thereby causing a reaction between the gases. In a preferred configuration the exhaust slots 114 that are adjacent to the output slots 112 where the first precursor gas G1 is supplied are exhausted through a first exhaust gas port connected to a first vacuum system, and the exhaust slots 114 that are adjacent to the output slot 112 where the second precursor gas G2 is supplied are exhausted through a second exhaust gas port connected to a second vacuum system.

Figure 30:
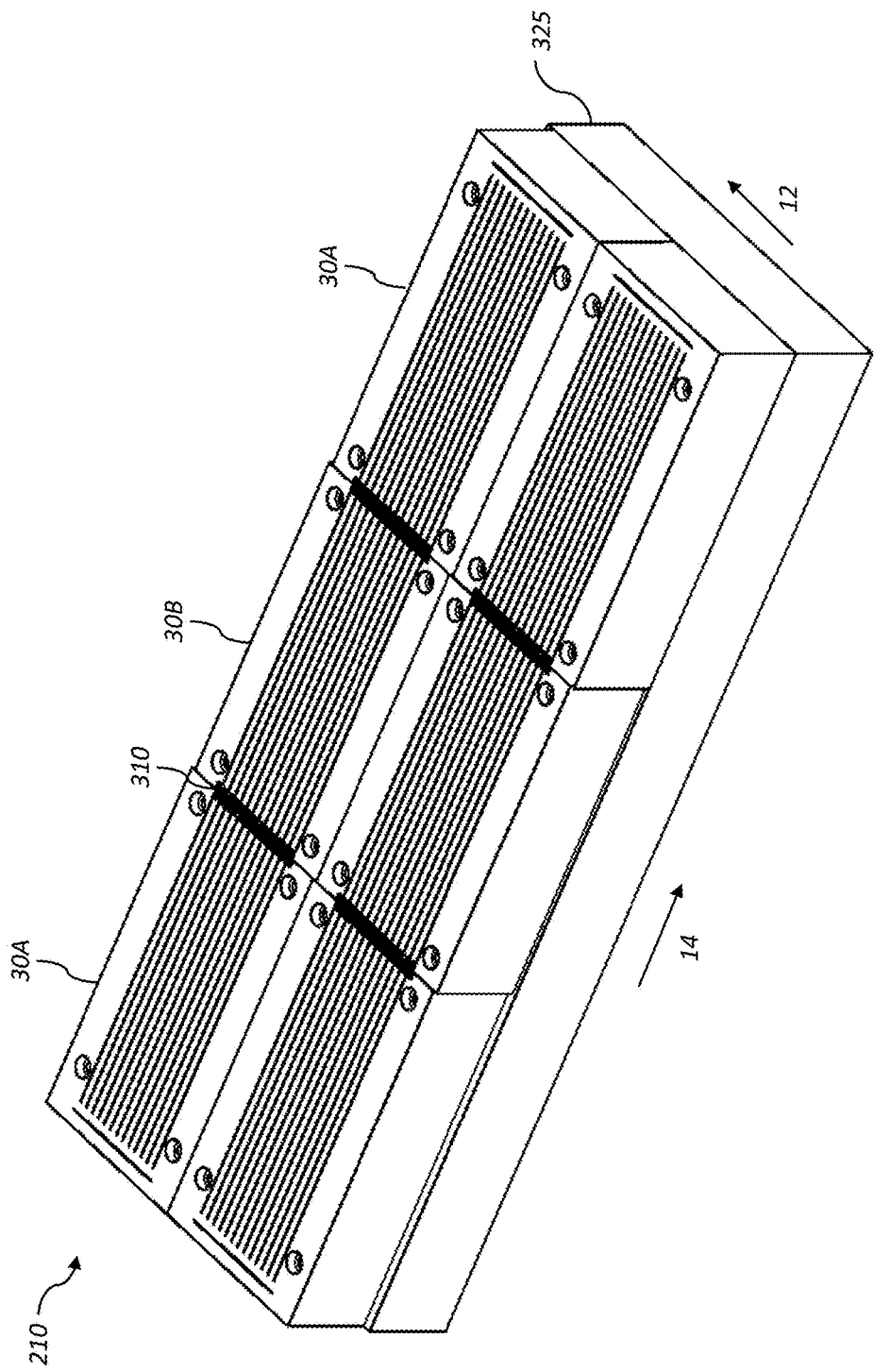
FIG. 30 illustrates an exemplary deposition unit including a 3×2 array of interlocking deposition heads.

The interlocking deposition heads 30A, 30B can also be arrayed in the in-track direction as illustrated in FIG. 30. In this example, a 3×2 array of deposition heads 30A, 30B is formed from two 3×1 arrays of interlocked deposition heads 30A, 30B, which are positioned so that they abut in the in-track direction 12. As shown, the individual deposition heads 30A, 30B are mounted on a common manifold 325, resulting in a deposition unit 210 that is three heads wide by two head long, including two center interlocking deposition heads 30B and four end interlocking deposition heads 30A. In an alternative configuration, the interlocking deposition heads can also contain interlocking features along the in-track edges to more precisely position the rows of deposition heads 30A, 30B relative to each other. In other configurations, arrays of cross-track interlocked deposition heads 30A, 30B may be arrayed in the in-track direction in a spaced apart configuration on a common manifold (similar to the non-interlocking head configuration of FIG. 15).

In a preferred embodiment, the deposition heads 30A, 30B are designed so that an M×N array can be assembled using only two types of deposition heads: end deposition heads 30A and center deposition heads 30B. (Wherein M is the cross-track dimension of the array and N is the in-track dimension of the array.) In the example, of FIG. 30, four end deposition heads 30A and two center deposition heads 30B are used. Advantageously, the end deposition heads 30A are of a single type, and as shown can be installed on either end of a row in the array. Likewise, the center deposition heads 30B are of a single type. To enable this, the abutting end 31A of an end deposition head 30A has the same design as the abutting end 31B of a center deposition head 30B. Accordingly, the abutting end 31A of an end deposition head 30A is adapted to interlock with either the abutting end 31A of another end deposition head 30A, or with the abutting end 31B of a center deposition head 30B.

The invention has been described in detail with particular reference to certain preferred embodiments thereof, but it will be understood that variations and modifications can be effected within the spirit and scope of the invention.

PARTS LIST 10 machine base
12 in-track direction
14 cross-track direction
15 external environment
25 manifold
30 deposition head
30A interlocking deposition head
30B interlocking deposition head
31A abutting end
31B abutting end
94 working distance
97 substrate
98 motion arrow
110 gas slot
112 output slot
114 exhaust slot
134 output face
135 mounting face
137 counterbore
138 alignment pins
139 gas connection opening
140 counterbore
142 sealing element
143 integrated sealing element
144 line-to-line contact
146 metallic gasket
147 corrugated sealing surface
148 integrated gasket
149 aperture
151 pocket
152 gas passage
154 gas connection
163 carrier element
164 aperture
173 carrier web
175 sealing ring
200 SALD system
205 deposition subsystem
210 deposition unit
225 common manifold
230 interface region
235 attachment face
240 counterbore
241 annular raised feature
250 counterbore
251 annular raised feature
270 relative motion means
280 substrate positioner module
301 end slot
305 deposition zone
308 inert zone
309 inert zone
310 interlocking structure
311 centerline
312 space
313 first reactive gas zone
314 purge zone
315 second reactive gas zone
316 flat region
317 overlap region
320 end region
321 left edge
322 right edge
325 common manifold
401 output slots

The invention claimed is:
1. A deposition unit for a thin film deposition system, comprising:
    a machine base;
    two or more separate deposition heads, each deposition head including:
        an output face having a plurality of gas openings;
        a mounting face opposite to and parallel with the output face, the mounting face including a plurality of deposition head gas ports; and gas passages connecting each of the gas openings on the output face to one of the deposition head gas ports; and a gas manifold rigidly attached to the machine base including:
an attachment face having one or more interface regions, each interface region being configured to interface with the mounting face of a deposition head and including a plurality of manifold gas ports in positions corresponding to the deposition head gas ports;
a plurality of gas connections; and
gas passages connecting each of the manifold gas ports to one of the gas connections;

wherein each of the two or more deposition heads is removably fastened to the gas manifold using one or more removable fasteners in an interface region with sealing elements positioned between the one or more deposition heads and the gas manifold to provide sealed connections between the manifold gas ports and the deposition head gas ports;

wherein the mounting face of each deposition head and the attachment face of the gas manifold include alignment features for aligning each deposition head with the interface region of the gas manifold in a repeatable position.

2. The deposition unit of claim 1, wherein the scaling elements associated with a particular deposition head are interconnected by a carrier element.

3. The deposition unit of claim 2, wherein the carrier element includes features that align with the alignment features of the deposition head or the gas manifold.

4. The deposition unit of claim 2, wherein the carrier element extends over the mounting face of the deposition head.

5. The deposition unit of claim 2, wherein the mounting face of the deposition head or the attachment face of the gas manifold includes a corresponding pocket that the carrier element fits within.

6. The deposition unit of claim 2, wherein sealing elements are integrally formed into the carrier element.

7. The deposition unit of claim 2, wherein sealing elements are inserted into holes in the carrier element.

8. The deposition unit of claim 1, wherein the sealing elements are made of an elastomeric material or a malleable plastically deformable material.

9. The deposition unit of claim 1, wherein the deposition head gas ports or the manifold gas ports are surrounded by counterbore features, and wherein the sealing elements fit within the counterbore features.

10. The deposition unit of claim 9, wherein the counterbore features include annular raised featured that engage with the sealing elements.

11. The deposition unit of claim 1, wherein the deposition unit includes a plurality of deposition heads, and wherein the fastened deposition heads are positioned such that the output faces of the deposition heads are all substantially co-planar.

12. The deposition unit of claim 1, wherein at least a portion of the mounting face of each the deposition head contacts a corresponding portion of the attachment face of the gas manifold.

13. The deposition unit of claim 1, wherein the gas openings in the output face of each deposition head include a plurality of gas output openings through which corresponding gaseous materials flow out of the deposition head.

14. The deposition unit of claim 13, wherein at least two of the gas output openings are connected to the same deposition head gas port such that the same gaseous material flows through the at least two gas output openings.

15. The deposition unit of claim 13, further including one or more gas supply systems connected to corresponding gas connections on the gas manifold, wherein the gas supply systems provide pressurized gaseous materials that flow through the connected gas passages in the gas manifold and the deposition head, and through the corresponding gas output openings.

16. The deposition unit of claim 13, wherein the gas openings in the output face of each deposition head further include a plurality of exhaust openings through which gaseous materials are exhausted.

17. The deposition unit of claim 16, further including one or more vacuum systems connected to gas connections on the gas manifold corresponding to the exhaust openings, wherein the vacuum systems draw gaseous materials through the through the connected gas passages in the gas manifold and the deposition head, and through the corresponding exhaust openings.

18. The deposition unit of claim 16, wherein the deposition head gas ports include:
a first reactive gaseous material gas port through which a first reactive gaseous material is supplied to one or more of the gas output openings;
a second reactive gaseous material gas port through which a second reactive gaseous material is supplied is supplied to one or more of the gas output openings;
an inert gaseous material gas port through which an inert gaseous material is supplied is supplied to one or more of the gas output openings;
a first exhaust gas port connected to one or more exhaust openings that are positioned between and adjacent to gas output openings through which the first reactive gaseous material and the inert gaseous material are supplied; and
a second exhaust gas port connected to one or more exhaust openings that are positioned between and adjacent to gas output openings through which the second reactive gaseous material and the inert gaseous material are supplied.

19. The deposition unit of claim 18, wherein the gas openings on the output face of each deposition head include five adjacent gas openings arranged in the following sequence:
a gas output opening connected to the first reactive gaseous material gas port;
an exhaust opening connected to the first exhaust gas port;
a gas output opening connected to the inert gaseous material gas port;
an exhaust opening connected to the second exhaust gas port; and
a gas output opening connected to the second reactive gaseous material gas port.

20. The deposition unit of claim 18, wherein the deposition head gas ports further include a second inert gaseous material gas port through which a second inert gaseous material is supplied is supplied to one or more of the gas output openings.

21. The deposition unit of claim 1, wherein the gas passages in the gas manifold connect each gas connection to a corresponding manifold gas port in each of the interface regions.

22. The deposition unit of claim 1, wherein the gas openings are gas slots extending in a cross-track direction on the output faces of the deposition heads, and wherein a motion controller moves the substrate in an in-track direction which is perpendicular to the cross-track direction.

23. The deposition unit of claim 22, wherein the interface regions corresponding to two of the deposition heads are adjacent to each other in the in-track direction.

24. The deposition unit of claim 22, wherein the interface regions corresponding to two of the deposition heads are adjacent to each other in the cross-track direction such that the adjacent deposition heads have abutting ends, wherein the abutting ends of the adjacent deposition heads include interlocking structures having an alternating sequence of protrusions and recesses such that the protrusions on the abutting end on one of the adjacent deposition heads fit into the recesses on the abutting end on the other of the adjacent deposition heads.

25. The deposition unit of claim 24, wherein the gas slots extend into the protrusions on the abutting ends such that in an overlap region the gas slots on one of the adjacent deposition heads overlap with the gas slots on the other of the adjacent deposition heads in the cross-track direction.

* * * * *